(12) United States Patent
McCulloch et al.

(10) Patent No.: US 10,403,822 B2
(45) Date of Patent: Sep. 3, 2019

(54) THIENOTHIOPHENE-ISOINDIGO

(71) Applicant: BASF SE, Ludwigshafen (DE)

(72) Inventors: Iain McCulloch, Eastleigh (GB); Iain Meager, Brighton (GB); Bob Schroeder, London (GB); Pascal Hayoz, Hofstetten (CH); Jean-Charles Flores, Mulhouse (FR); Klemens Mathauer, Heidelberg (DE); Patrice Bujard, Courtepin (CH); Daniel Kaelblein, Mannheim (DE)

(73) Assignee: BASF SE, Ludwigshafen (DE)

( * ) Notice: Subject to any disclaimer, the term of this patent is extended or adjusted under 35 U.S.C. 154(b) by 121 days.

(21) Appl. No.: 15/324,548

(22) PCT Filed: Jul. 7, 2015

(86) PCT No.: PCT/IB2015/055118
§ 371 (c)(1),
(2) Date: Jan. 6, 2017

(87) PCT Pub. No.: WO2016/005891
PCT Pub. Date: Jan. 14, 2016

(65) Prior Publication Data
US 2017/0207392 A1 Jul. 20, 2017

(30) Foreign Application Priority Data

Jul. 10, 2014 (EP) .................................... 14176441

(51) Int. Cl.
*C08G 61/12* (2006.01)
*H01L 51/00* (2006.01)
*H01L 51/05* (2006.01)

(52) U.S. Cl.
CPC ........ *H01L 51/0036* (2013.01); *C08G 61/124* (2013.01); *C08G 61/126* (2013.01); *H01L 51/0035* (2013.01); *H01L 51/0043* (2013.01); *C08G 2261/124* (2013.01); *C08G 2261/1412* (2013.01); *C08G 2261/314* (2013.01); *C08G 2261/3223* (2013.01); *C08G 2261/3246* (2013.01); *C08G 2261/344* (2013.01); *C08G 2261/411* (2013.01); *C08G 2261/414* (2013.01); *C08G 2261/512* (2013.01); *C08G 2261/514* (2013.01); *C08G 2261/516* (2013.01); *C08G 2261/91* (2013.01); *C08G 2261/92* (2013.01); *C08G 2261/95* (2013.01); *H01L 51/0558* (2013.01)

(58) Field of Classification Search
CPC .... C08G 2261/3243; C08G 2261/3246; C08G 61/126; C08G 2261/414; C08G 2261/91; C07D 417/14; H01L 51/0043; H01L 51/0036; H01L 51/0047; H01L 51/4253; Y02E 10/549
See application file for complete search history.

(56) References Cited

U.S. PATENT DOCUMENTS

| | | | |
|---|---|---|---|
| 8,758,880 B2 | 6/2014 | Flores et al. | |
| 2010/0297405 A1 | 11/2010 | Flores et al. | |
| 2013/0193379 A1 | 8/2013 | Wigglesworth et al. | |
| 2017/0084839 A1* | 3/2017 | Nanson | C07D 471/04 |

FOREIGN PATENT DOCUMENTS

| | | |
|---|---|---|
| CN | 103626975 A | 3/2014 |
| JP | 2012-109365 A | 6/2012 |
| WO | WO 2009/053291 A1 | 4/2009 |
| WO | WO 2015/139802 A1 | 9/2015 |

OTHER PUBLICATIONS

International Search Report dated Nov. 27, 2015 in PCT/IB2015/055118.
International Preliminary Report on Patentability and Written Opinion dated Jan. 10, 2017 in PCT/IB2015/055118.
Supplementary European Search Report dated Feb. 27, 2018 in European Patent Application No. 15 81 9160, 2 pages.
Na Zhao, et al., "Synthesis of a Thiophene-fused Isoindigo Derivative: a Potential Building Block for Organic Semiconductors", Tetrahedron Letters, vol. 55 No. 5, XP028817673, 2014, pp. 1040-1044.
The specification of EP14000972 filed on Mar. 17, 2014.

* cited by examiner

*Primary Examiner* — Shane Fang
(74) *Attorney, Agent, or Firm* — Oblon, McClelland, Maier & Neustadt, L.L.P.

(57) ABSTRACT

Polymers containing at least one unit of formula

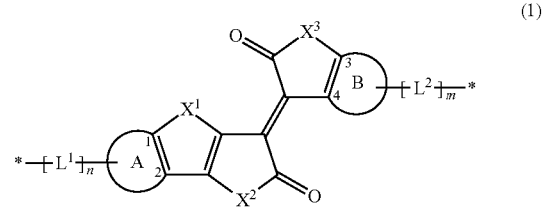

(1)

wherein
$X^1$, $X^2$ and $X^3$ are independently from each other O, S or $NR^1$,
a process for their preparation, intermediates and electronic devices containing these polymers as semiconducting material.

13 Claims, No Drawings

THIENOTHIOPHENE-ISOINDIGO

The present invention relates to polymers, to a process for the preparation of these polymers, to intermediates, to electronic devices comprising these polymers, as well as to the use of these polymers as semiconducting material.

Organic semiconducting materials can be used in electronic devices such as organic photovoltaic devices (OPVs), organic field-effect transistors (OFETs), organic light emitting diodes (OLEDs), organic photodiodes (OPDs) and organic electrochromic devices (ECDs).

It is desirable that the organic semiconducting materials are compatible with liquid processing techniques such as spin coating as liquid processing techniques are convenient from the point of processability, and thus allow the production of low cost organic semiconducting material-based electronic devices. In addition, liquid processing techniques are also compatible with plastic substrates, and thus allow the production of light weight and mechanically flexible organic semiconducting material-based electronic devices.

For application in organic photovoltaic devices (OPVs), organic field-effect transistors (OFETs), and organic photodiodes (OPDs), it is further desirable that the organic semiconducting materials show high charge carrier mobility.

For application in organic photovoltaic devices (OPVs) and organic photodiodes (OPDs), the organic semiconducting materials should also show a strong absorption of the visible light and of the near infra-red light.

The use of iso-indigo-type compounds as semiconducting materials in electronic devices is known in the art.

WO 2009/053291 describes semiconducting polymers comprising the following units

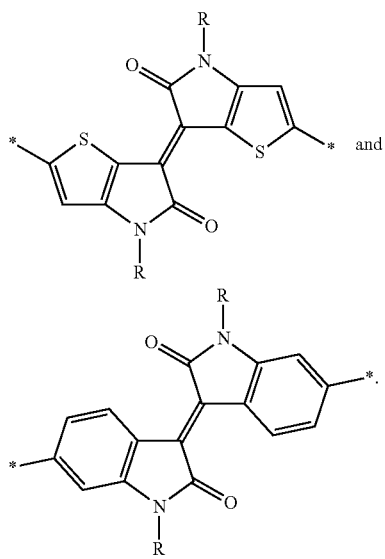

and organic field effect transistors comprising these polymers.

It was the object of the present invention to provide organic semiconducting materials.

The polymers of the present invention comprise at least one unit of formula

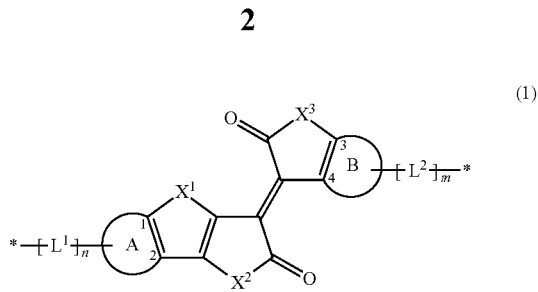

(1)

wherein $X^1$, $X^2$ and $X^3$ are independently from each other O, S or $NR^1$, A is selected from the group consisting of

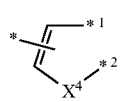

A1

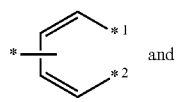 and

A2

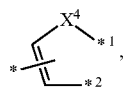,

A3

B is selected from the group consisting of

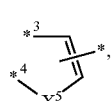,

B1

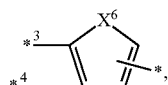,

B2

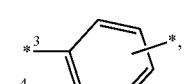,

B3

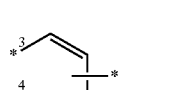,

B4

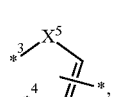,

B5

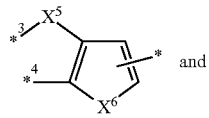 and

B6

-continued

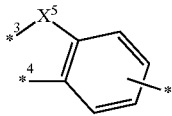

B7 wherein
X$^4$, X$^5$ and X$^6$ are independently from each other O, S or NR$^1$, A1, A2, A3, B1, B2, B3, B4, B5, B6 or B7 can be substituted with one to three substituents R$^2$, R$^1$ is at each occurrence selected from the group consisting of H, C$_{1-100}$-alkyl, C$_{2-100}$-alkenyl, C$_{2-100}$-alkynyl, C$_{5-12}$-cycloalkyl, C$_{6-18}$-aryl, a 5 to 20 membered heteroaryl, C(O)—C$_{1-100}$-alkyl, C(O)—C$_{5-12}$-cycloalkyl and C(O)—OC$_{1-100}$-alkyl,
wherein
C$_{1-100}$-alkyl, C$_{2-100}$-alkenyl and C$_{2-100}$-alkynyl can be substituted with one to fourty substituents independently selected from the group consisting of C$_{5-8}$-cycloalkyl, C$_{6-14}$-aryl, 5 to 14 membered heteroaryl, OR$^a$, OC(O)—R$^a$, C(O)—OR$^a$, C(O)—R$^a$, NR$^a$R$^b$, NR$^a$—C(O)R$^b$, C(O)—NR$^a$R$^b$, N[C(O)R$^a$][C(O)R$^b$], SR$^a$, Si(R$^{Sia}$)(R$^{Sib}$)(R$^{Sic}$), —O—Si(R$^{Sia}$)(R$^{Sib}$)(R$^{Sic}$), halogen, CN, and NO$_2$; and at least two CH$_2$-groups, but not adjacent CH$_2$-groups, of C$_{1-100}$-alkyl, C$_{2-100}$-alkenyl and C$_{2-100}$-alkynyl can be replaced by O or S,
C$_{5-12}$-cycloalkyl can be substituted with one to six substituents independently selected from the group consisting of C$_{1-60}$-alkyl, C$_{2-60}$-alkenyl, C$_{2-60}$-alkynyl, C$_{5-8}$-cycloalkyl, C$_{6-14}$-aryl, 5 to 14 membered heteroaryl, OR$^a$, OC(O)—R$^a$, C(O)—OR$^a$, C(O)—R$^a$, NR$^a$R$^b$, NR$^a$—C(O)R$^b$, C(O)—NR$^a$R$^b$, N[C(O)R$^a$][C(O)R$^b$], SR$^a$, Si(R$^{Sia}$)(R$^{Sib}$)(R$^{Sic}$), —O—Si(R$^{Sia}$)(R$^{Sib}$)(R$^{Sic}$), halogen, CN, and NO$_2$; and one or two CH$_2$-groups, but not adjacent CH$_2$-groups, of C$_{5-12}$-cycloalkyl can be replaced by O, S, OC(O), CO, NR$^a$ or NR$^a$—CO,
C$_{6-18}$-aryl and 5 to 20 membered heteroaryl can be substituted with one to six substituents independently selected from the group consisting of C$_{1-60}$-alkyl, C$_{2-60}$-alkenyl, C$_{2-60}$-alkynyl, C$_{5-8}$-cycloalkyl, C$_{6-14}$-aryl, 5 to 14 membered heteroaryl, OR$^a$, OC(O)—R$^a$, C(O)—OR$^a$, C(O)—R$^a$, NR$^a$R$^b$, NR$^a$—C(O)R$^b$, C(O)—NR$^a$R$^b$, N[C(O)R$^a$][C(O)R$^b$], SR$^a$, Si(R$^{Sia}$)(R$^{Sib}$)(R$^{Sic}$), —O—Si(R$^{Sia}$)(R$^{Sib}$)(R$^{Sic}$), halogen, CN, and NO$_2$,
wherein
R$^a$ and R$^b$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl and 5 to 14 membered heteroaryl,
R$^{Sia}$, R$^{Sib}$ and R$^{Sic}$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl, 5 to 14 membered heteroaryl, O—C$_{1-60}$-alkyl, O—C$_{2-60}$-alkenyl, O—C$_{2-60}$-alkynyl, O—C$_{5-8}$-cycloalkyl, O—C$_{6-14}$-aryl, O-5 to 14 membered heteroaryl, —[O—SiR$^{Sid}$R$^{Sie}$]$_o$—R$^{Sif}$, NR$^5$R$^6$, halogen and O—C(O)—R$^5$,
wherein
o is an integer from 1 to 50,
R$^{Sid}$, R$^{Sie}$, R$^{Sif}$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl, 5 to 14 membered heteroaryl,
O—C$_{1-60}$-alkyl, O—C$_{2-60}$-alkenyl, O—C$_{2-60}$-alkynyl, O—C$_{5-8}$-cycloalkyl, O—C$_{6-14}$-aryl, O-5 to 14 membered heteroaryl, —[O—SiR$^{Sig}$R$^{Sih}$]$_p$R$^{Sii}$, NR$^{50}$R$^{60}$, halogen and O—C(O)—R$^{50}$;
wherein
p is an integer from 1 to 50,
R$^{Sig}$, R$^{Sih}$, R$^{Sii}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, 5 to 10 membered heteroaryl, O—C$_{1-30}$-alkyl, O—C$_{2-30}$-alkenyl, O—C$_{2-30}$-alkynyl, O—C$_{5-6}$-cycloalkyl, O—C$_{6-10}$-aryl, O-5 to 10 membered heteroaryl, O—Si(CH$_3$)$_3$, NR$^{500}$R$^{600}$, halogen and O—C(O)—R$^{500}$,
R$^5$, R$^6$, R$^{50}$, R$^{60}$, R$^{500}$ and R$^{600}$ are independently selected from the group consisting of H, C$_{1-60}$-alkyl, C$_{2-60}$-alkenyl, C$_{2-60}$-alkynyl, C$_{5-8}$-cycloalkyl, C$_{6-14}$-aryl, and 5 to 14 membered heteroaryl,
C$_{1-60}$-alkyl, C$_{2-60}$-alkenyl and C$_{2-60}$-alkynyl can be substituted with one to twenty substituents selected from the group consisting of C$_{5-6}$-cycloalkyl, C$_{6-10}$-aryl, OR$^c$, OC(O)—R$^c$, C(O)—OR$^c$, C(O)—R$^c$, NR$^c$R$^d$, NR$^c$—C(O)R$^d$, C(O)—NR$^c$R$^d$, N[C(O)R$^c$][C(O)R$^d$], SR$^c$, Si(R$^{Sij}$)(R$^{Sik}$)(R$^{Sil}$), —O—Si(R$^{Sij}$)(R$^{Sik}$)(R$^{Sil}$), halogen, CN, and NO$_2$; and at least two CH$_2$-groups, but not adjacent CH$_2$-groups, of C$_{1-60}$-alkyl, C$_{2-60}$-alkenyl and C$_{2-60}$-alkynyl can be replaced by O or S,
C$_{5-8}$-cycloalkyl can be substituted with one to five substituents selected from the group consisting of C$_{1-30}$-alkyl, C$_{2-30}$-alkenyl, C$_{2-30}$-alkynyl, C$_{5-6}$-cycloalkyl, C$_{6-10}$-aryl, OR$^c$, OC(O)—R$^c$, C(O)—OR$^c$, C(O)—R$^c$, NR$^c$R$^d$, NR$^c$—C(O)R$^d$, C(O)—NR$^c$R$^d$, N[C(O)R$^c$][C(O)R$^d$], SR$^c$, Si(R$^{Sij}$)(R$^{Sik}$)(R$^{Sil}$), —O—Si(R$^{Sij}$)(R$^{Sik}$)(R$^{Sil}$), halogen, CN, and NO$_2$; and one or two CH$_2$-groups, but not adjacent CH$_2$-groups, of C$_{5-8}$-cycloalkyl can be replaced by O, S, OC(O), CO, NR$^c$ or NR$^c$—CO,
C$_{6-14}$-aryl and 5 to 14 membered heteroaryl can be substituted with one to five substituents independently selected from the group consisting of C$_{1-30}$-alkyl, C$_{2-30}$-alkenyl, C$_{2-30}$-alkynyl, C$_{5-6}$-cycloalkyl, C$_{6-10}$-aryl, OR$^c$, OC(O)—R$^c$, C(O)—OR$^c$, C(O)—R$^c$, NR$^c$R$^d$, NR—C(O)R$^d$, C(O)—NR$^c$R$^d$, N[C(O)R$^c$][C(O)R$^d$], SR$^c$, Si(R$^{Sij}$)(R$^{Sik}$)(R$^{Sil}$), —O—Si(R$^{Sij}$)(R$^{Sik}$)(R$^{Sil}$), halogen, CN and NO$_2$;
wherein
R$^c$ and R$^d$ are independently selected from the group consisting of H, C$_{1-30}$-alkyl, C$_{2-30}$-alkenyl and C$_{2-30}$-alkynyl,
R$^{Sij}$, R$^{Sik}$ and R$^{Sil}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, 5 to 10 membered heteroaryl, O—C$_{1-30}$-alkyl, O—C$_{2-30}$-alkenyl, O—C$_{2-30}$-alkynyl, O—C$_{5-6}$-cycloalkyl, O—C$_{6-10}$-aryl, O-5 to 10 membered heteroaryl, —[O—SiR$^{Sim}$R$^{Sin}$]q-R$^{Sio}$, NR$^7$R$^8$, halogen, and O—C(O)—R$^7$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sip}R^{Siq}]_r$—$R^{Sir}$, $NR^{70}R^{80}$, halogen, and O—C(O)—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—C(O)—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen, CN and $NO_2$, $R^2$ is at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl, 5 to 20 membered heteroaryl, $OR^{21}$, OC(O)—$R^{21}$, C(O)—$OR^{21}$, C(O)—$R^{21}$, $NR^{21}R^{22}$, $NR^{21}$—C(O)$R^{22}$, C(O)—$NR^{21}R^{22}$, N[C(O)$R^{21}$][C(O)$R^{22}$], $SR^{21}$, halogen, CN, $SiR^{Sis}R^{Sit}R^{Siu}$ and OH, wherein $R^{21}$ and $R^{22}$ and are independently selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, OC(O)—$R^e$, C(O)—$OR^e$, C(O)—$R^e$, $NR^eR^f$, $NR^e$—C(O)$R^f$, C(O)—$NR^eR^f$, N[C(O)$R^e$][C(O)$R^f$], $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^e$, OC(O)—$R^e$, C(O)—$OR^e$, C(O)—$R^e$, $NR^eR^f$, $NR^e$—C(O)$R^f$, C(O)—$NR^eR^f$, N[C(O)$R^e$][C(O)$R^f$], $SR^e$, halogen, CN, $SiR^{Sis}R^{Sit}R^{Siu}$ and $NO_2$; and one or two $CH_2$-groups, but not adjacent $CH_2$-groups, of $C_{5-12}$-cycloalkyl can be replaced by O, S, OC(O), CO, $NR^e$ or $NR^e$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^e$, OC(O)—$R^e$, C(O)—$OR^e$, C(O)—$R^e$, $NR^eR^f$, $NR^e$—C(O)$R^f$, C(O)—$NR^eR^f$, N[C(O)$R^e$][C(O)$R^f$], $SR^e$, halogen, CN, $SiR^{Sis}R^{Sit}R^{Siu}$ and $NO_2$, wherein $R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, OC(O)—$R^g$, C(O)—$OR^g$, C(O)—$R^g$, $NR^gR^h$, $NR^g$—C(O)$R^h$, C(O)—$NR^gR^h$, N[C(O)$R^g$][C(O)$R^h$], $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, OC(O)—$R^g$, C(O)—$OR^g$, C(O)—$R^g$, $NR^gR^h$, $NR^g$—C(O)$R^h$, C(O)—$NR^gR^h$, N[C(O)$R^g$][C(O)$R^h$], $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, OC(O)—$R^g$, C(O)—$OR^g$, C(O)—$R^g$, $NR^gR^h$, NR—C(O)$R^h$, C(O)—$NR^gR^h$, N[C(O)$R^g$][C(O)$R^h$], $SR^g$, halogen, CN, and $NO_2$;

wherein $R^g$ and $R^h$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$, n is 0, 1, 2 or 3, m is 0, 1, 2 or 3, and $L^1$ and are $L^2$ are independently from each other and at each occurrence selected from the group consisting of $C_{6-18}$-arylene, 5 to 20 membered heteroarylene,

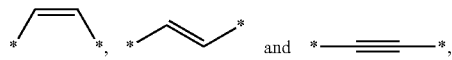

wherein $C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, OC(O)—$R^{31}$, C(O)—$OR^{31}$, C(O)—$R^{31}$, $NR^{31}R^{32}$, $NR^{31}$—C(O)$R^{32}$, C(O)—$NR^{31}R^{32}$, N[C(O)$R^{31}$][C(O)$R^{32}$], $SR^{31}$ halogen, CN, $SiR^{Siv}R^{Siw}R^{Six}$ and OH, and wherein

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to membered heteroaryl, $C(O)$—$R^{41}$, $C(O)$—$NR^{41}R^{42}$, $C(O)$—$OR^{41}$ and CN, wherein $R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and wherein $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)^i$—$R^j$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and one or two $CH_2$-groups, but not adjacent $CH_2$-groups, of $C_{5-12}$-cycloalkyl can be replaced by O, S, OC(O), CO, $NR^i$ or $NR^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—R, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

wherein $R^k$ and $R^l$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

Halogen can be F, Cl, Br and I.

$C_{1-4}$-alkyl, $C_{1-10}$-alkyl, $C_{1-20}$-alkyl, $C_{1-30}$-alkyl, $C_{1-36}$-alkyl, $C_{1-50}$-alkyl, $C_{1-60}$-alkyl and $C_{1-100}$-alkyl can be branched or unbranched. Examples of $C_{1-4}$-alkyl are methyl, ethyl, n-propyl, isopropyl, n-butyl, sec-butyl, isobutyl and tert-butyl. Examples of $C_{1-10}$-alkyl are $C_{1-4}$-alkyl, n-pentyl, neopentyl, isopentyl, n-(1-ethyl)propyl, n-hexyl, n-heptyl, n-octyl, n-(2-ethyl)hexyl, n-nonyl and n-decyl. Examples of $C_{1-20}$-alkyl are $C_{1-10}$-alkyl and n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$). Examples of $C_{1-30}$-alkyl, $C_{1-36}$-alkyl, $C_{1-50}$-alkyl, $C_{1-60}$-alkyl and $C_{1-100}$-alkyl are $C_{1-20}$-alkyl and n-docosyl ($C_{22}$), n-tetracosyl ($C_{24}$), n-hexacosyl ($C_{26}$), n-octacosyl ($C_{28}$) and n-triacontyl ($C_{30}$).

$C_{2-10}$-alkenyl, $C_{2-20}$-alkenyl, $C_{2-30}$-alkenyl, $C_{2-60}$-alkenyl and $C_{2-100}$-alkenyl can be branched or unbranched. Examples of $C_{1-20}$-alkenyl are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl and docenyl. Examples of $C_{2-20}$-alkenyl, $C_{2-60}$-alkenyl and $C_{2-100}$-alkenyl are $C_{2-10}$-alkenyl and linoleyl ($C_{18}$), linolenyl ($C_{18}$), oleyl ($C_{18}$), and arachidonyl ($C_{20}$). Examples of $C_{2-30}$-alkenyl are $C_{2-20}$-alkenyl and erucyl ($C_{22}$).

$C_{2-10}$-alkynyl, $C_{2-20}$-alkynyl, $C_{2-30}$-alkynyl, $C_{2-60}$-alkynyl and $C_{2-100}$-alkynyl can be branched or unbranched. Examples of $C_{2-10}$-alkynyl are ethynyl, 2-propynyl, 2-butynyl, 3-butynyl, pentynyl, hexynyl, heptynyl, octynyl, nonynyl and decynyl. Examples of $C_{2-20}$-alkynyl, $C_{2-30}$-alkynyl, $C_{2-60}$-alkynyl and $C_{2-100}$-alkynyl are undecynyl, dodecynyl, undecynyl, dodecynyl, tridecynyl, tetradecynyl, pentadecynyl, hexadecynyl, heptadecynyl, octadecynyl, nonadecynyl and icosynyl ($C_{20}$).

Examples of $C_{5-6}$-cycloalkyl are cyclopentyl and cyclohexyl. Examples of $C_{5-8}$-cycloalkyl are $C_{5-6}$-cycloalkyl and cycloheptyl and cyclooctyl. $C_{5-12}$-cycloalkyl are $C_{5-8}$-cycloalkyl and cyclononyl, cyclodecyl, cycloundecyl and cyclododecyl.

Examples of $C_{6-10}$-aryl are phenyl,

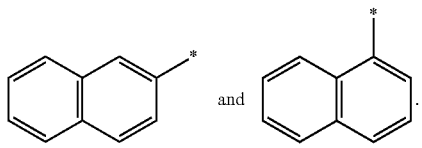 [SMILES: *c1ccc2ccccc2c1 ; *c1cccc2ccccc12]

and

Examples of $C_{6-14}$-aryl are $C_{6-10}$-aryl and

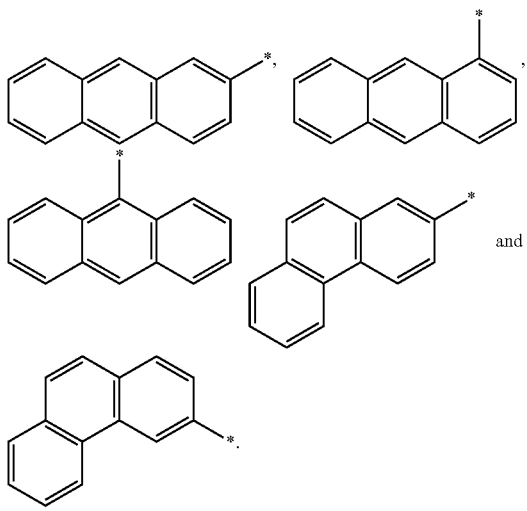

and

Examples of $C_{6-18}$-aryl are $C_{6-14}$-aryl and

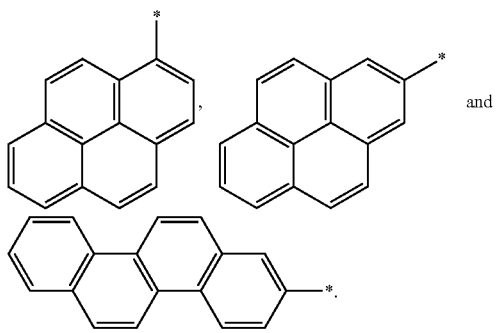

5 to 10 membered heteroaryl are 5 to 10 membered monocyclic or polycyclic, such as dicyclic, tricyclic or tetracyclic, ring systems, which comprise at least one heteroaromatic ring, and which may also comprise non-aromatic rings, which may be substituted by =O.

5 to 14 membered heteroaryl are 5 to 14 membered monocyclic or polycyclic, such as dicyclic, tricyclic or tetracyclic, ring systems, which comprise at least one heteroaromatic ring, and which may also comprise non-aromatic rings, which may be substituted by =O.

5 to 20 membered heteroaryl are 5 to 20 membered monocyclic or polycyclic, such as dicyclic, tricyclic or tetracyclic, ring systems, which comprise at least one heteroaromatic ring, and which may also comprise non-aromatic rings, which may be substituted by =O.

Examples of 5 to 10 membered heteroaryl are

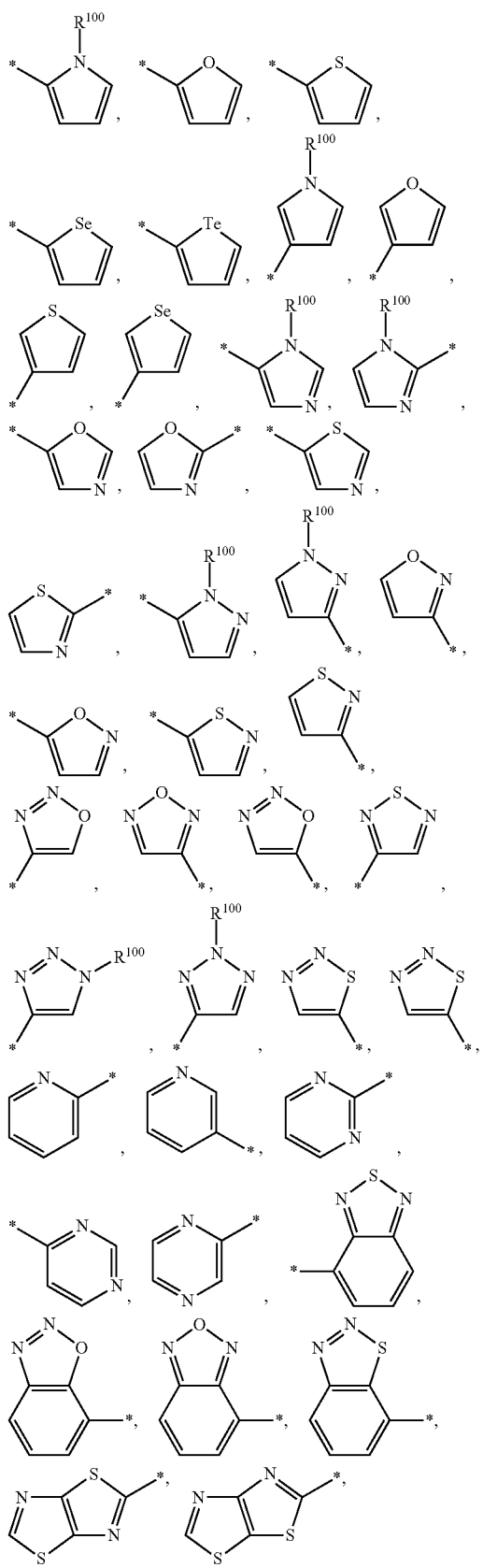

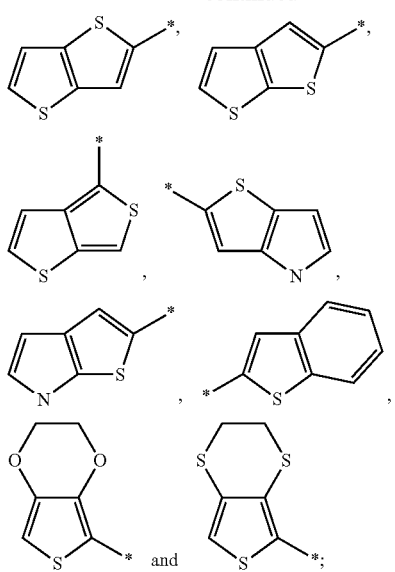
examples of 5 to 14 membered heteroaryl are the examples given for the 5 to 10 membered heteroaryl and
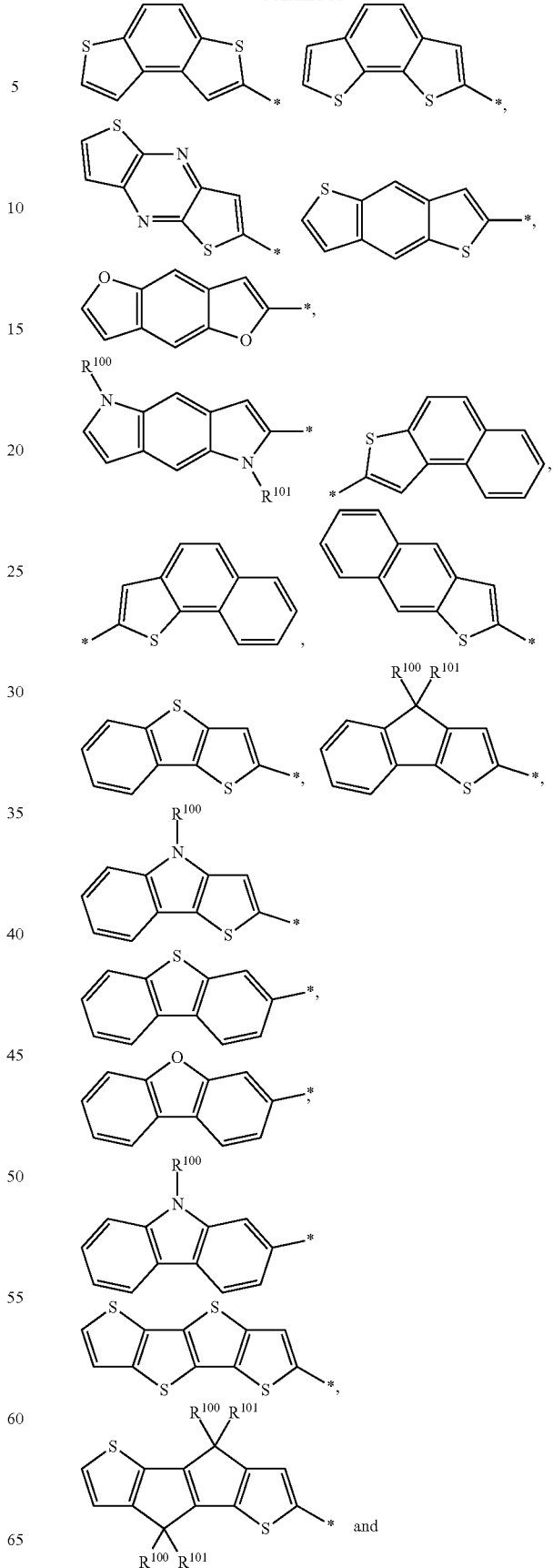

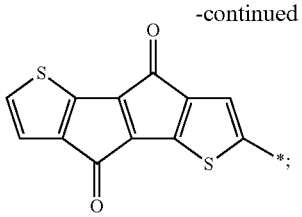

examples of 5 to 20 membered heteroaryl are the examples given for the 5 to 14 membered heteroaryl and

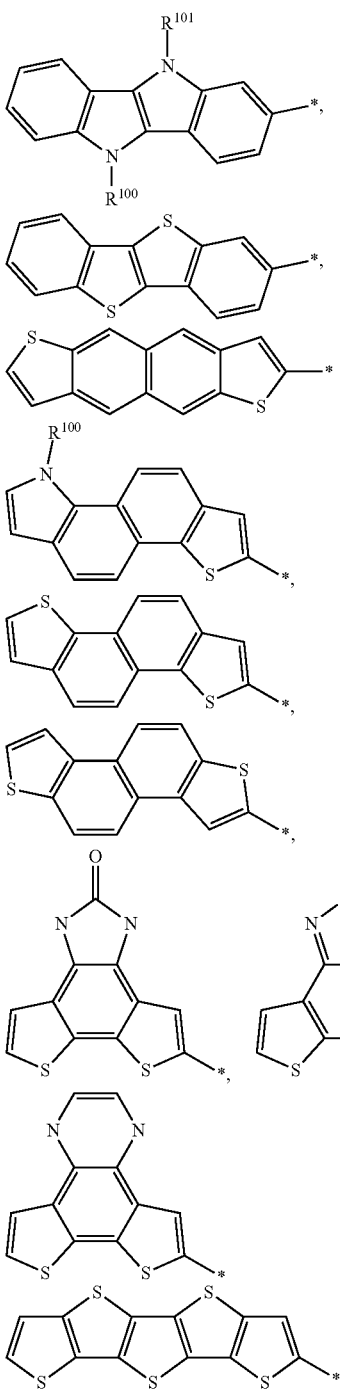

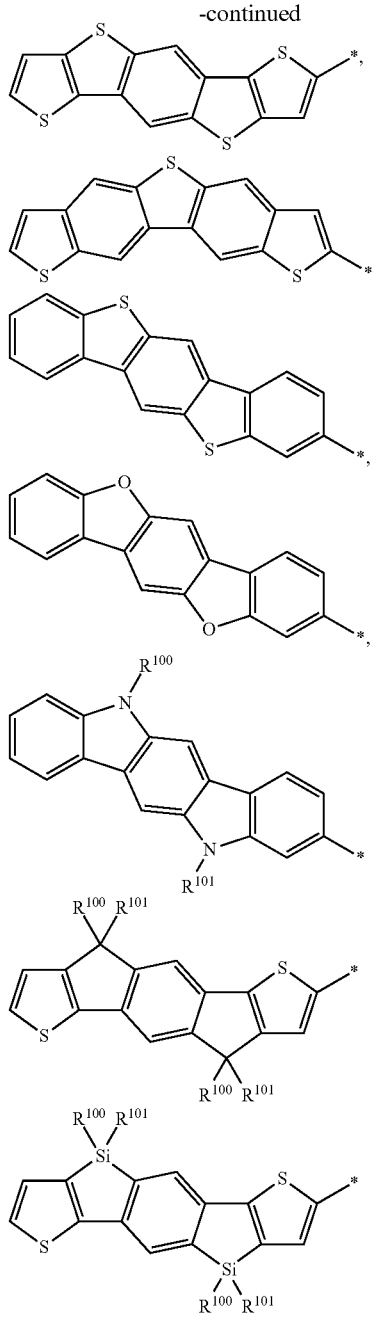

wherein
$R^{100}$ and $R^{101}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{100}$ and $R^{101}$, if attached to the same atom, together with the atom, to which they are attached, form a 5 to 12 membered ring system,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^q$, OC(O)—$R^q$, C(O)—$OR^q$, C(O)—$R^q$, $NR^qR^r$, $NR^q$—C(O)$R^r$, C(O)—$NR^qR^r$, $N[C(O)R^q][C(O)R^r]$, $SR^q$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)-R^q$, $C(O)-OR^q$, $C(O)-R^q$, $NR^qR^r$, $NR^q-C(O)R^r$, $C(O)-NR^qR^r$, $N[C(O)R^q][C(O)R^r]$, $SR^q$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)-R^q$, $C(O)-OR^q$, $C(O)-R^q$, $NR^qR^r$, $NR^q-C(O)R^r$, $C(O)-NR^qR^r$, $N[C(O)R^q][C(O)R^r]$, $SR^q$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)-R^q$, $C(O)-OR^q$, $C(O)-R^q$, $NR^qR^r$, $NR^q-C(O)R^r$, $C(O)-NR^qR^r$, $N[C(O)R^q][C(O)R^r]$, $SR^q$, halogen, CN, and $NO_2$;

wherein $R^q$ and $R^r$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

$C_{6-18}$-arylene is a 6 to 18 membered monocyclic or polycyclic, such as dicyclic, tricyclic or tetracyclic, ring system, which comprises at least one C-aromatic ring, and which may also comprise non-aromatic rings, which may be substituted by =O.

Examples of $C_{6-18}$-arylene are

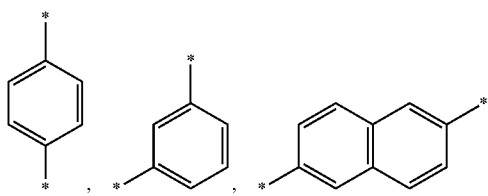

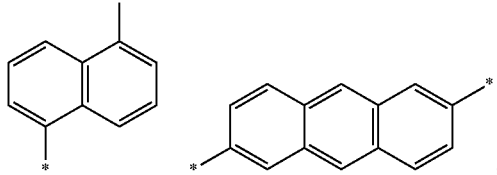

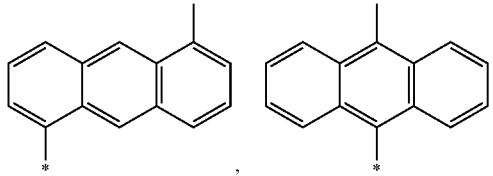

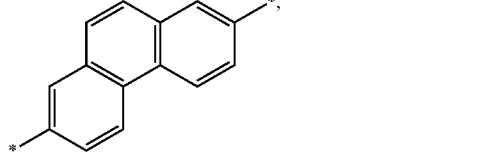

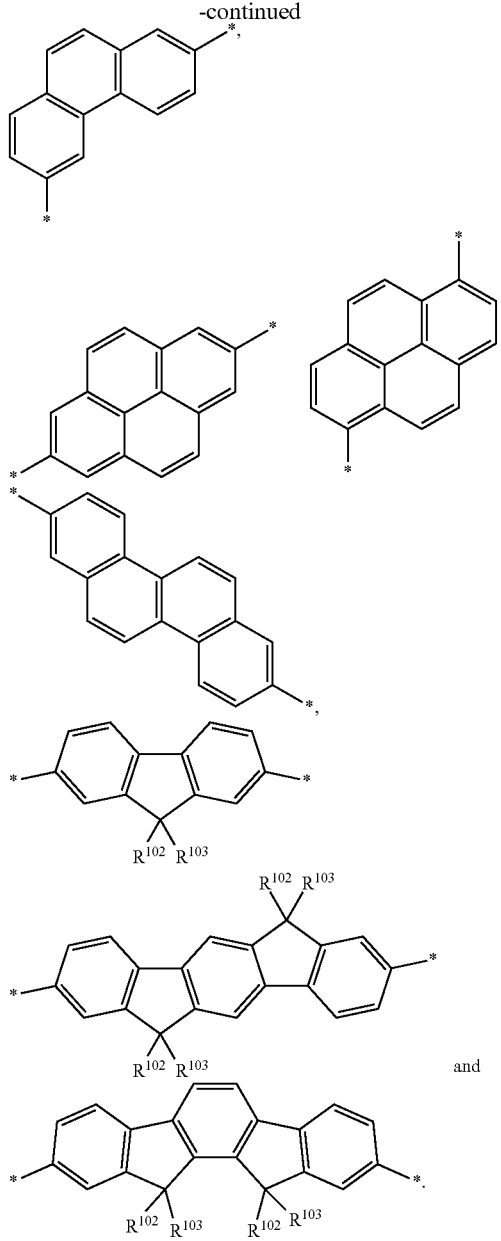

wherein $R^{102}$ and $R^{103}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{102}$ and $R^{103}$, if attached to the same atom, together with the atom, to which they are attached, form a 5 to 12 membered ring system, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^s$, $OC(O)-R^t$, $C(O)-OR^s$, $C(O)-R^s$, $NR^sR^t$, $NR^s-C(O)R^t$, $C(O)-NR^sR^t$, $N[C(O)R^s][C(O)R^t]$, $SR^s$, halogen, CN, and $NO_2$;

$C_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;

5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;
wherein
R$^s$ and R$^t$ are independently selected from the group consisting of H, C$_{1-10}$-alkyl, C$_{2-10}$-alkenyl and C$_{2-10}$-alkynyl,
wherein
C$_{1-10}$-alkyl, C$_{2-10}$-alkenyl and C$_{2-10}$-alkynyl can be substituted with one to five substituents selected from the group consisting of halogen, CN and NO$_2$.

5 to 20 membered heteroarylene is a 5 to 20 membered monocyclic or polycyclic, such as dicyclic, tricyclic or tetracyclic, ring system, which comprises at least one heteroaromatic ring, and which may also comprise non-aromatic rings, which may be substituted by =O.

Examples of 5 to 20 membered heteroarylene are

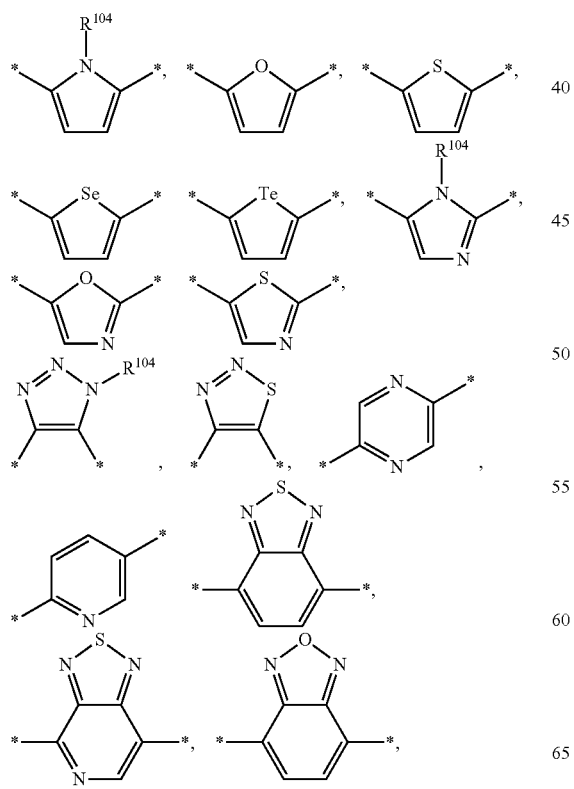

-continued

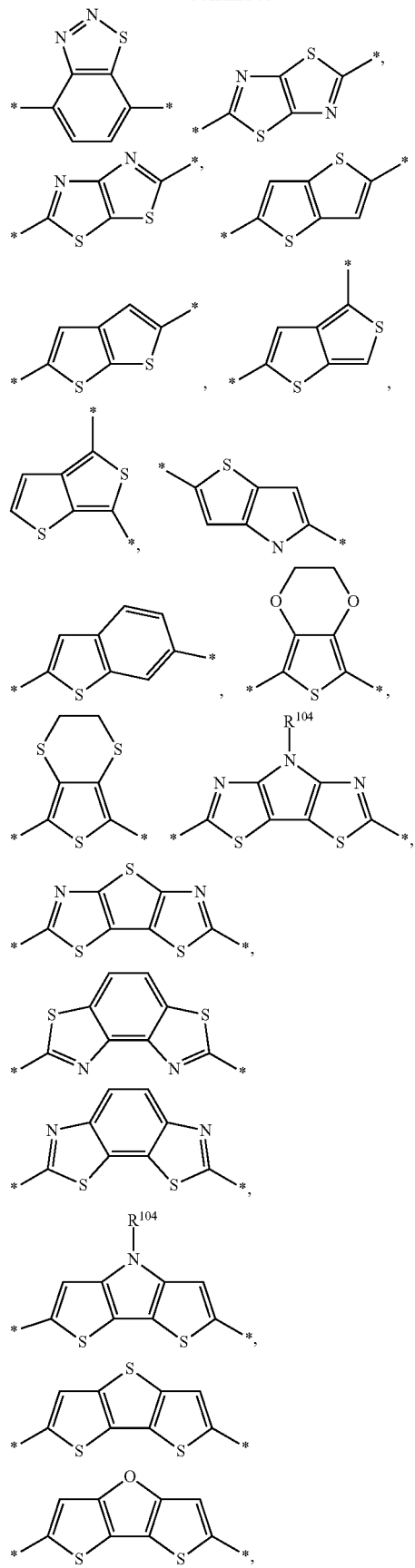

-continued
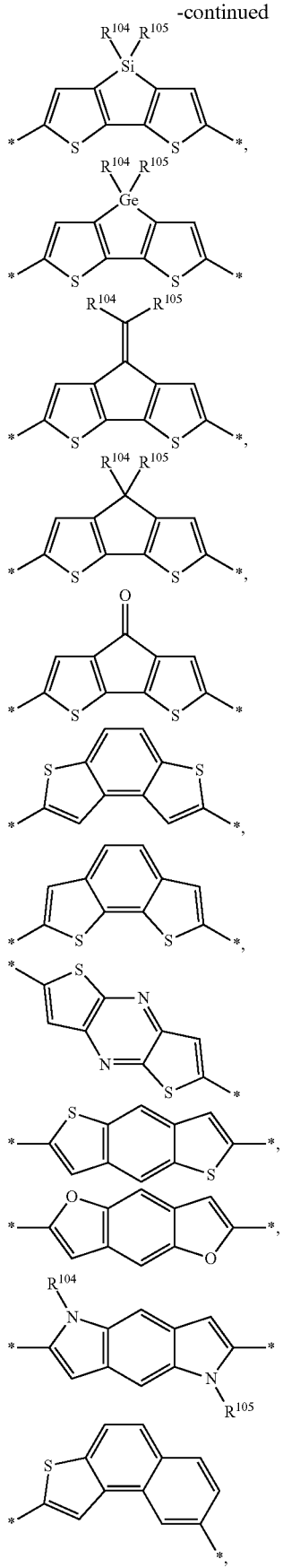
-continued
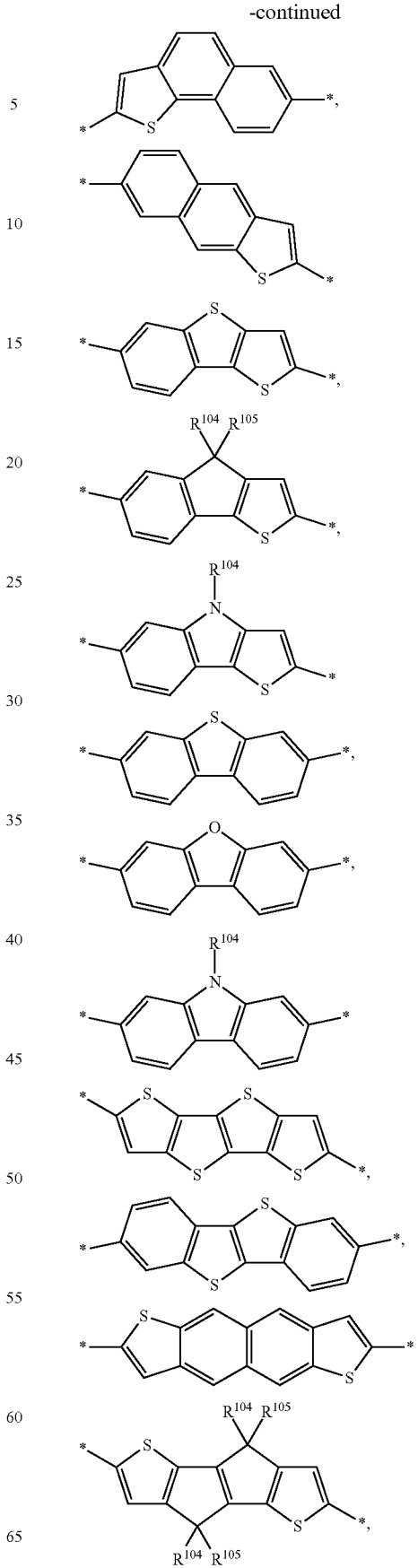

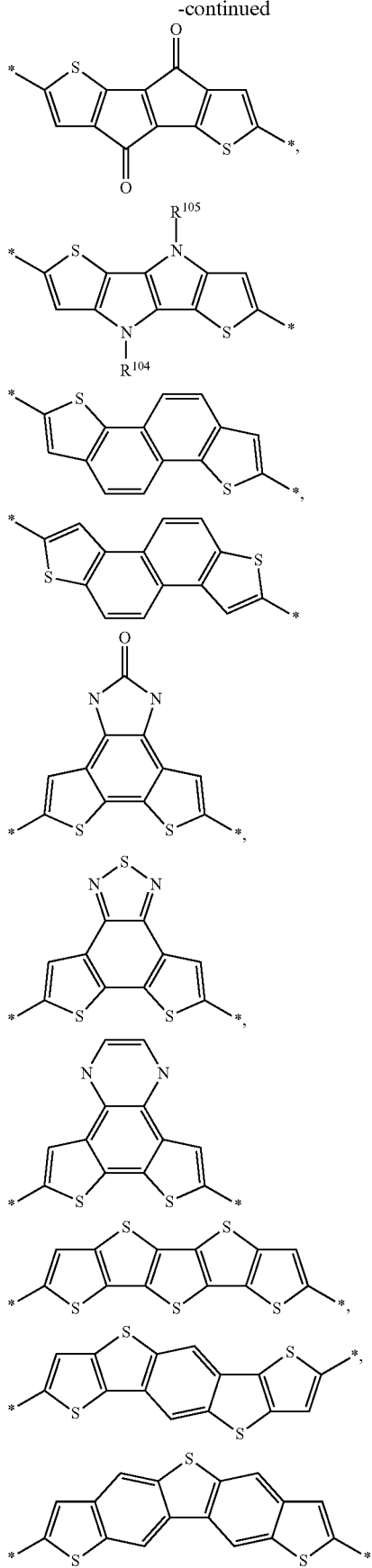

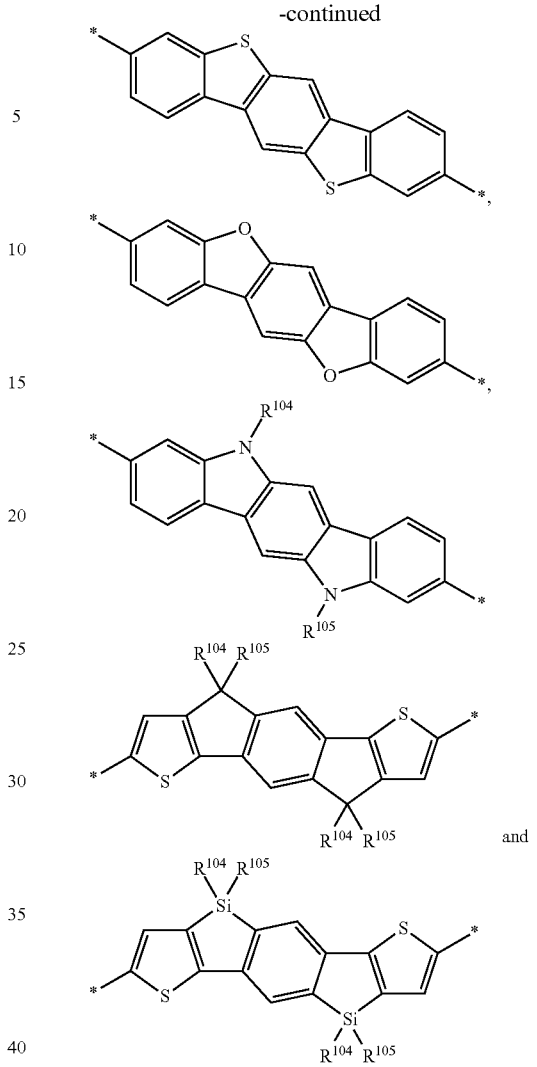

wherein
$R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and $R^{105}$, if attached to the same atom, together with the atom, to which they are attached, form a 5 to 12 membered ring system, wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)-R^t$, $C(O)-OR^s$, $C(O)-R^s$, $NR^sR^t$, $NR^s-C(O)R^t$, $C(O)-NR^sR^t$, $N[C(O)R^s][C(O)R^t]$, $SR^s$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)-R^t$, $C(O)-OR^s$, $C(O)-R^s$, $NR^sR^t$, $NR^s-C(O)R^t$, $C(O)-NR^sR^t$, $N[C(O)R^s][C(O)R^t]$, $SR^s$, halogen, CN, and $NO_2$;

wherein
$R^s$ and $R^t$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and $NO_2$.

The 5 to 12 membered ring system can contain, in addition to the atom, to which $R^{100}$ and $R^{101}$, respectively $R^{102}$ and $R^{103}$, respectively $R^{104}$ and $R^{105}$, are attached, ring members selected from the group consisting of $CH_2$, O, S and $NR^u$, wherein $R^u$ is at each occurrence selected from the group consisting of H, $C_{1-10}$-alkyl, $C_{2-10}$-alkenyl and $C_{2-10}$-alkynyl.

Preferably, the polymers of the present invention comprise at least 60% by weight of units of formula (I) based on the weight of the polymer.

More preferably, the polymers of the present invention comprise at least 80% by weight of units of formula (I) based on the weight of the polymer.

Most preferably, the polymers of the present invention essentially consist of units of formula (I).

Preferably, $X^1$, $X^2$ and $X^3$ are independently from each other S or $NR^1$.

More preferably, $X^1$ is S, and $X^2$ and $X^3$ are $NR^1$.

Preferably, A is

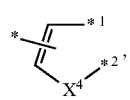

A1 wherein
$X^4$ is S or $NR^1$, and
A1 can be substituted with one substituent $R^2$.

More preferably, A is

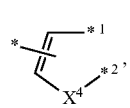

A1 wherein
$X^4$ is S and
A1 is not substituted.

Preferably, B is selected from the group consisting of

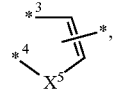

B1

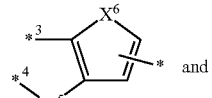

and B2

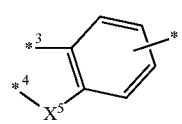

B3 wherein
$X^5$ and $X^6$ are independently from each other S or $NR^1$, and
B1, B2 and B3 can be substituted with one to three substituents $R^2$.

More preferably, B is

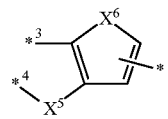

B2 wherein
$X^5$ and $X^6$ are independently from each other S or $NR^1$, and
B2 can be substituted with one substituent $R^2$.

Most preferably, B is

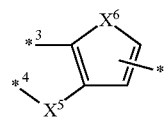

B2 wherein
$X^5$ and $X^6$ are S, and
B2 is not substituted.

Preferably, $R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, and a 5 to 20 membered heteroaryl,
wherein
$C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)-R^a$, $C(O)-OR^a$, $C(O)-R^a$, $NR^a-C(O)R^b$, $C(O)-NR^aR^b$, $SR^a$, $Si(R^{Sia})(R^{Sib})(R^{Sic})$, $-O-Si(R^{Sia})(R^{Sib})(R^{Sic})$, halogen and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S,
$C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen, and CN; and one or two $CH_2$-groups, but not adjacent $CH_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen, and CN, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, —[O—$SiR^{Sid}R^{Sie}]_o$—$R^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—$SiR^{Sig}R^{Sih}]_p$—$R^{Sii}$, wherein p is an integer from 1 to 50, $R^{Sig}$, $R^{Sih}$ and $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen, and CN; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen, and CN; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sim}R^{Sin}]_q$—$R^{Sio}$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sip}R^{Siq}]r$-$R^{Sir}$, $NR^{70}R^{80}$, halogen, and O—$C(O)$—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—$C(O)$—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

More preferably, $R^1$ is at each occurrence selected from the group consisting of $C_{1-100}$-alkyl, $C_{2-100}$-alkenyl and $C_{2-100}$-alkynyl, wherein $C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen, and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—$SiR^{Sid}R^{Sie}]_o$—$R^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sig}$R$^{Sih}$]$_o$—R$^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN; and at least two CH$_2$-groups, but not adjacent CH$_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN; and one or two CH$_2$-groups, but not adjacent CH$_2$-groups, of $C_{5-8}$-cycloalkyl can be replaced by O, S, OC(O), CO, NR$^c$ or NR$^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sij}$), —O—Si(R$^{Sij}$)(R$^{Sik}$)(R$^{Sil}$), halogen, and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sim}$R$^{Sin}$]$_q$—R$^{Sio}$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sip}$R$^{Siq}$]$_r$—R$^{Sir}$, wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

Even more preferably, $R^1$ is at each occurrence selected from the group consisting of $C_{1-50}$-alkyl, $C_{2-50}$-alkenyl and $C_{2-50}$-alkynyl, wherein $C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, OR$^a$, SR$^a$, Si(R$^{Sia}$)(R$^{Sib}$)(R$^{Sic}$), —O—Si(R$^{Sia}$)(R$^{Sib}$)(R$^{Sic}$), halogen, and CN; and at least two CH$_2$-groups, but not adjacent CH$_2$-groups, of $C_{1-50}$-alkyl, $C_{2-50}$-alkenyl and $C_{2-50}$-alkynyl can be replaced by O or S, wherein $R^a$ and $R^b$ are independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl, $R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sid}$R$^{Sie}$]$_o$—R$^{Sif}$, wherein o is an integer from 1 to 50, $R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sig}$R$^{Sih}$]$_p$R$^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^5$, $R^6$, $R^{50}$, $R^{60}$, $R^{500}$ and $R^{600}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

Most preferably, $R^1$ is at each occurrence selected from the group consisting of $C_{1-36}$-alkyl, $C_{2-36}$-alkenyl and $C_{2-36}$-alkynyl, wherein $C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, OR$^a$, SR$^a$, Si(R$^{Sia}$)(R$^{Sib}$)(R$^{Sic}$), —O—Si(R$^{Sia}$)(R$^{Sib}$)(R$^{Sic}$), halogen, and CN; and at least two CH$_2$-groups, but not adjacent CH$_2$-groups, of $C_{1-36}$-alkyl, $C_{2-36}$-alkenyl and $C_{2-36}$-alkynyl can be replaced by O or S, wherein $R^a$ and $R^b$ are independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl $R^{Sia}$, $R^{Sib}$ and $R^{Sic}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, —[O—SiR$^{Sid}$R$^{Sie}$]$_o$—R$^{Sif}$ wherein
o is an integer from 1 to 50,
$R^{Sid}$, $R^{Sie}$, $R^{Sif}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, —[O—SiR$^{Sig}$R$^{Sih}$]$_p$R$^{Sij}$,
wherein
p is an integer from 1 to 50,
$R^{Sig}$ $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, O—Si(CH$_3$)$_3$,
$R^5$, $R^6$, $R^{50}$, $R^{60}$, $R^{500}$ and $R^{600}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, and 5 to 10 membered heteroaryl,
$C_{1-20}$-alkyl, $C_{2-20}$-alkenyl and $C_{2-20}$-alkynyl can be substituted with one to ten substituents selected from the group consisting of halogen and CN.
In particular, $R^1$ is at each occurrence unsubstituted $C_{1-36}$-alkyl.
Preferably, $R^2$ is at each occurrence selected from the group consisting of $C_{1-30}$-alkyl and halogen,
wherein
$C_{1-30}$-alkyl can be substituted with one to ten substituents independently selected from the group consisting of $C_{5-8}$-cycloalkyl, $C_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and at least two CH$_2$-groups, but not adjacent CH$_2$-groups, of $C_{1-30}$-alkyl can be replaced by O or S,
wherein
$R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—Si(CH$_3$)$_3$,
R$^e$ and R$^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;
$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;
wherein
R$^g$ and R$^h$ are independently selected from the group consisting of H, $C_{1-10}$-alkyl, $C_{2-10}$-alkenyl and $C_{2-10}$-alkynyl, wherein
$C_{1-10}$-alkyl, $C_{2-10}$-alkenyl and $C_{2-10}$-alkynyl can be substituted with one to five substituents selected from the group consisting of halogen, CN and NO$_2$.
More preferably, $R^2$ is at each occurrence selected from the group consisting of unsubstituted $C_{1-30}$-alkyl and halogen.
Preferably, n is 0, 1 or 2. More preferably, n is 0 or 1. Most preferably, n is 0.
Preferably, m is 0, 1 or 2.
Preferably, $L^1$ and $L^2$ are independently from each other and at each occurrence selected from the group consisting of $C_{6-18}$-arylene, 5 to 20 membered heteroarylene,
and

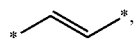, wherein
$C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, OR$^{31}$, OC(O)—R$^{31}$, C(O)—OR$^{31}$, C(O)—R$^{31}$, NR$^{31}$R$^{32}$, NR$^{31}$—C(O)R$^{32}$, C(O)—NR$^{31}$R$^{32}$, SR$^{31}$, halogen, CN, SiR-$^{Siv}$R$^{Siw}$R$^{Six}$ and OH, and
wherein

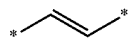

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to membered heteroaryl, C(O)—R$^{41}$, C(O)—NR$^{41}$R$^{42}$, C(O)—OR$^{41}$ and CN,
wherein
$R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of $C_{1-30}$-alkyl, $C_{2-30}$-alkenyl and $C_{2-30}$-alkynyl can be replaced by O or S,
$C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$ R$^{Six}$ and NO$_2$; and one or two CH$_2$-groups, but not adjacent CH$_2$-groups, of $C_{5-12}$-cycloalkyl can be replaced by O, S, OC(O), CO, NR$^i$ or NR$^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)$—$R^i$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—Si(CH$_3$)$_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—R, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

wherein $R^k$ and $R^l$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

More preferably, $L^1$ and $L^2$ are independently from each other and at each occurrence selected from the group consisting of 5 to 20 membered heteroarylene, and

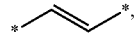, wherein 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, $NR^{31}$—$C(O)R^{32}$, $C(O)$—$NR^{31}R^{32}$, $SR^{31}$, halogen, CN, $SiR^{Siv}R^{Siw}R^{Six}$ and OH, and wherein

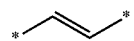

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to membered heteroaryl, $C(O)$—$R^{41}$, $C(O)$—$NR^{41}R^{42}$, $C(O)$—$OR^{41}$ and CN, wherein $R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and wherein $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, $OC(O)$—$R^j$, $C(O)$—$OR^j$, $C(O)$—$R^j$, $NR^iR^j$, $NR^i$—$C(O)R^j$, $C(O)$—$NR^iR^j$, $N[C(O)R^j][C(O)R]$, $SR^i$, halogen, CN, $SiR^{Siv}R^{Siw}R^{Six}$ and $NO_2$; and at least two CH$_2$-groups, but not adjacent CH$_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^j$, $NR^iR^j$, $NR^i$—$C(O)R$, $C(O)$—$NR^iR^j$, $N[C(O)R^i][C(O)R^j]$, $SR^i$, halogen, CN, $SiR^{Siv}R^{Siw}R^{Six}$ and $NO_2$; and one or two CH$_2$-groups, but not adjacent CH$_2$-groups, of $C_{5-12}$-cycloalkyl can be replaced by O, S, OC(O), CO, $NR^i$ or $NR^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—Si(CH$_3$)$_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)-R^l$, $C(O)-OR^k$, $C(O)-R^k$, $NR^kR^l$, $NR^k-C(O)R^l$, $C(O)-NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)-R$, $C(O)-OR^k$, $C(O)-R^k$, $NR^kR^l$, $NR^k-C(O)R^l$, $C(O)-NR^kR^l$, $N[C(O)R^k][C(O)R^l]$, $SR^k$, halogen, CN, and $NO_2$;

wherein $R^k$ and $R^l$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

Even more preferably, $L^1$ and $L^2$ are independently from each other and at each occurrence selected from the group consisting of 5 to 20 membered heteroarylene, and

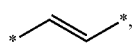

wherein 5 to 20 membered heteroarylene is selected from the group consisting of

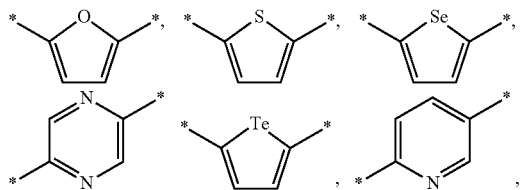

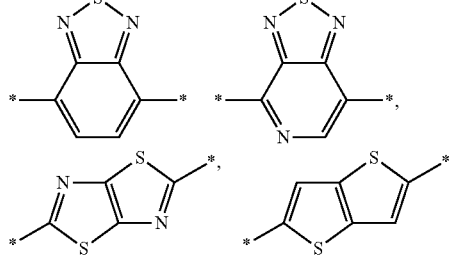

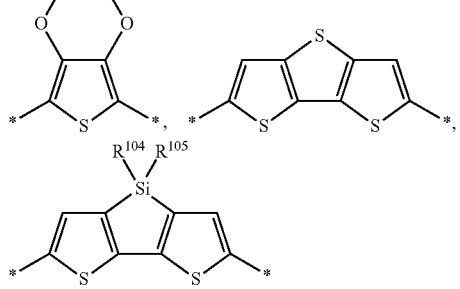

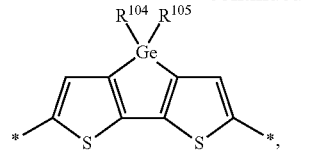

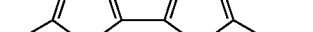

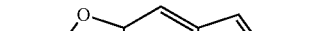

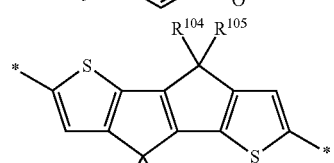

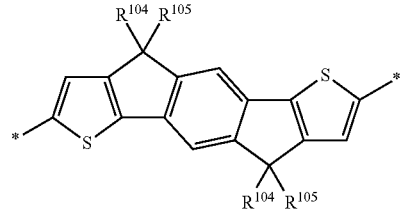

and

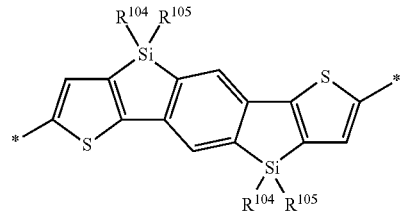

wherein $R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and $R^{105}$, if attached to the same atom, together with the atom, to which they are attached, form a 5 to 12 membered ring system, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^s$, $OC(O)-R^t$, $C(O)-OR^s$, $C(O)-R^s$, $NR^sR^t$, $NR^s-C(O)R^t$, $C(O)-NR^sR^t$, $N[C(O)R^s][C(O)R^t]$, $SR^s$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)-R^t$, $C(O)-OR^s$, $C(O)-R^s$, $NR^sR^t$, $NR^s-C(O)R^t$, $C(O)-NR^sR^t$, $N[C(O)R^s][C(O)R^t]$, $SR^s$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

wherein $R^s$ and $R^t$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$, wherein 5 to 20 membered heteroarylene can be substituted with one to six substituents $R^3$ at each occurrence selected from the group consisting of $C_{1-30}$-alkyl and halogen, and wherein

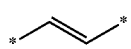

can be substituted with one or two substituents $R^4$ at each occurrence selected from the group consisting of $C_{1-30}$-alkyl, $C(O)$—$R^{41}$, $C(O)$—$OR^{41}$ and CN, wherein $R^{41}$ is at each occurrence $C_{1-30}$-alkyl.

Most preferably, $L^1$ and $L^2$ are independently from each other and at each occurrence 5 to 20 membered heteroarylene, wherein 5 to 20 membered heteroarylene is selected from the group consisting of

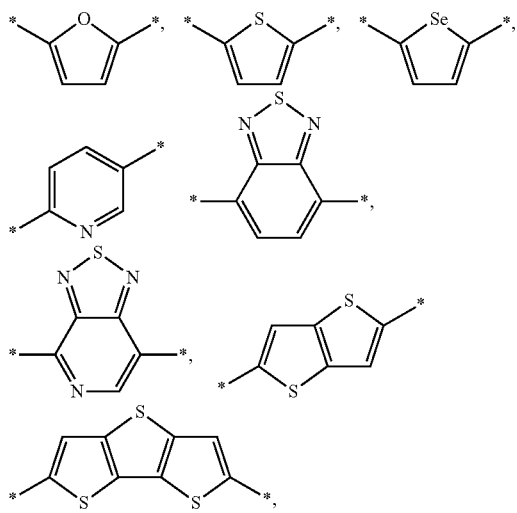

-continued

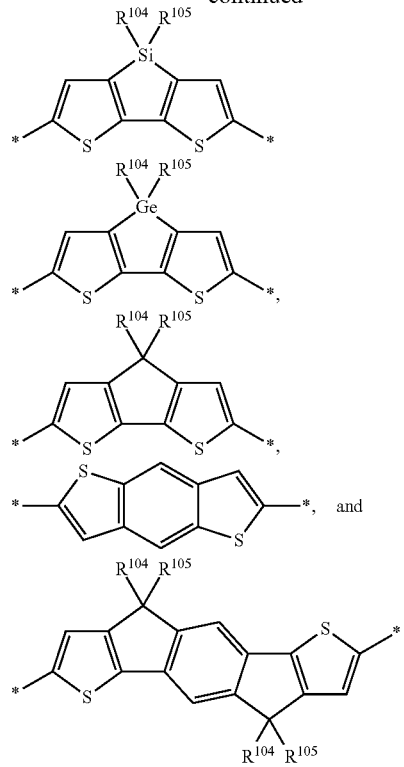

wherein $R^{104}$ and $R^{105}$ are independently and at each occurrence selected from the group consisting of H and $C_{1-20}$-alkyl, wherein 5 to 20 membered heteroarylene can be substituted with one to six substituents $R^3$ at each occurrence selected from the group consisting of $C_{1-30}$-alkyl and halogen.

In particular, $L^1$ and $L^2$ are independently from each other and at each occurrence 5 to 20 membered heteroarylene, wherein 5 to 20 membered heteroarylene is selected from the group consisting of

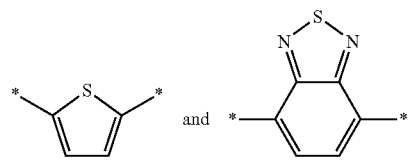 [SMILES: *c1ccc(*)s1 ; *c1ccc(*)c2nsnc12]

wherein 5 to 20 membered heteroarylene is unsubstituted.

In preferred polymers comprising at least one unit of formula (1)

$X^1$, $X^2$ and $X^3$ are independently from each other O, S or $NR^1$,

A is selected from the group consisting of

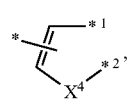

A1

-continued

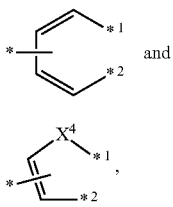
A2 and

A3

B is selected from the group consisting of

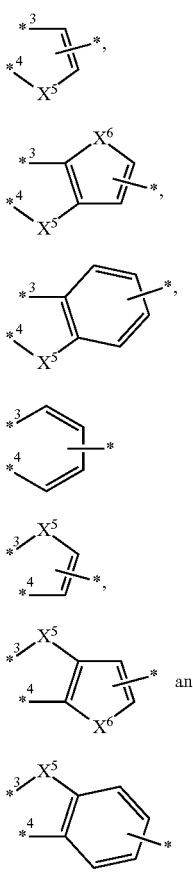

B1

B2

B3

B4

B5

B6 and

B7 wherein
X⁴, X⁵ and X⁶ are independently from each other O, S or NR¹,
A1, A2, A3, B1, B2, B3, B4, B5, B6 or B7 can be substituted with one to three substituents R²,
R¹ is at each occurrence selected from the group consisting of $C_{1-100}$-alkyl, $C_{2-100}$-alkenyl and $C_{2-100}$-alkynyl, wherein
  $C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen, and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S, wherein
$R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl,
$R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—$SiR^{Sid}R^{Sie}]_o$—$R^{Sif}$,
wherein
o is an integer from 1 to 50,
$R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—$SiR^{Sig}R^{Sih}]_p$—$R^{Sij}$,
wherein
p is an integer from 1 to 50,
$R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$,
$R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl,
$C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^d$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen, and CN; and at least two $CH_2$-groups, but not adjacent $CH_2$-groups, of $C_{1-60}$-alkyl, $C_{2-60}$-alkenyl and $C_{2-60}$-alkynyl can be replaced by O or S,
$C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^d$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen, and CN; and one or two $CH_2$-groups, but not adjacent $CH_2$-groups, of $C_{5-8}$-cycloalkyl can be replaced by O, S, OC(O), CO, $NR^c$ or $NR^c$—CO,
$C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—$Si(R^{Sij})(R^{Sik})(R^{Sil})$, halogen, and CN;
wherein
$R^c$ and $R^d$ are independently selected from the group consisting of H, $C_{1-30}$-alkyl, $C_{2-30}$-alkenyl and $C_{2-30}$-alkynyl,
$R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sim}R^{Sin}]_q$—$R^{Sio}$,
wherein
q is an integer from 1 to 50,
$R^{Sim}$, $R^{Sin}$, $R^{Sio}$ are independently selected from the group consisting of H, $C_{1-30}$-alkyl, $C_{2-30}$- alkenyl, $C_{2-30}$-alkynyl, $C_{5-6}$-cycloalkyl, $C_{6-10}$-aryl, —[O—$SiR^{Sip}R^{Siq}$]$_r$—$R^{Sir}$,
wherein
r is an integer from 1 to 50,
$R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$,
$R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl,
$C_{1-30}$-alkyl, $C_{2-30}$-alkenyl and $C_{2-30}$-alkynyl can be substituted with one to ten substituents selected from the group consisting of halogen and CN,
$R^2$ is at each occurrence selected from the group consisting of $C_{1-30}$-alkyl and halogen,
wherein
$C_{1-30}$-alkyl can be substituted with one to ten substituents independently selected from the group consisting of $C_{5-8}$-cycloalkyl, $C_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and at least two CH$_2$-groups, but not adjacent CH$_2$-groups, of $C_{1-30}$-alkyl can be replaced by O or S,
wherein
$R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—Si(CH$_3$)$_3$,
R$^e$ and R$^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;
$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

wherein
R$^g$ and R$^h$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and NO$_2$,
n is 0, 1, 2 or 3,
m is 0, 1, 2 or 3, and
$L^1$ and $L^2$ are independently from each other and at each occurrence selected from the group consisting of $C_{6-18}$-arylene, 5 to 20 membered heteroarylene,
and

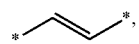

wherein
$C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, OR$^{31}$, OC(O)—R$^{31}$, C(O)—OR$^{31}$, C(O)—R$^{31}$, NR$^{31}$R$^{32}$, NR$^{31}$—C(O)R$^{32}$, C(O)—NR$^{31}$R$^{32}$, SR$^{31}$, halogen, CN, SiR-$^{Siv}$R$^{Siw}$R$^{Six}$ and OH, and
wherein

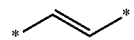

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to membered heteroaryl, C(O)—R$^{41}$, C(O)—NR$^{41}$R$^{42}$, C(O)—OR$^{41}$ and CN,
wherein
$R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, OR$^i$, OC(O)—R$^j$, C(O)—OR$^i$, C(O)—R$^j$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of $C_{1-30}$-alkyl, $C_{2-30}$-alkenyl and $C_{2-30}$-alkynyl can be replaced by O or S,
$C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, OR$^i$, OC(O)—R$^j$, C(O)—OR$^i$, C(O)—R$^j$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of $C_{5-12}$-cycloalkyl can be replaced by O, S, OC(O), CO, NR$^i$ or NR$^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—R, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

wherein $R^k$ and $R^l$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

In more preferred polymers comprising at least one unit of formula (1)

$X^1$, $X^2$ and $X^3$ are independently from each other S or $NR^1$,

A is

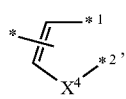

A1 wherein $X^4$ is S or $NR^1$, and

A1 can be substituted with one substituent $R^2$,

B is selected from the group consisting of

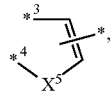

B1

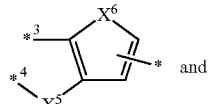

B2

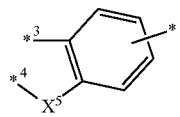

B3 wherein $X^5$ and $X^6$ are independently from each other S or $NR^1$, and

B1, B2 and B3 can be substituted with one to three substituents $R^2$, $R^1$ is at each occurrence selected from the group consisting of $C_{1-50}$-alkyl, $C_{2-50}$-alkenyl and $C_{2-50}$-alkynyl, wherein $C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, —O—$Si(R^{Sia})(R^{Sib})(R^{Sic})$, halogen, and CN; and at least two $CH_2$-groups, but not adjacent $CH_2$-groups, of $C_{1-50}$-alkyl, $C_{2-50}$-alkenyl and $C_{2-50}$-alkynyl can be replaced by O or S, wherein $R^a$ and $R^b$ are independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl, $R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sid}R^{Sie}]_o$—$R^{Sif}$, wherein o is an integer from 1 to 50, $R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sig}R^{Sih}]_p R^{Sij}$, wherein p is an integer from 1 to 50, $R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$, $R^5$, $R^6$, $R^{50}$, $R^{60}$, $R^{500}$ and $R^{600}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN, $R^2$ is at each occurrence selected from the group consisting of unsubstituted $C_{1-30}$-alkyl and halogen, n is 0, 1 or 2, m is 0, 1 or 2, and L¹ and L² are independently from each other and at each occurrence selected from the group consisting of 5 to 20 membered heteroarylene, and

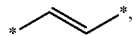, wherein 5 to 20 membered heteroarylene can be substituted with one to six substituents R³ at each occurrence selected from the group consisting of C₁₋₃₀-alkyl, C₂₋₃₀-alkenyl, C₂₋₃₀-alkynyl, C₅₋₁₂-cycloalkyl, C₆₋₁₈-aryl and 5 to 20 membered heteroaryl, OR³¹, OC(O)—R³¹, C(O)—OR³¹, C(O)—R³¹, NR³¹R³², NR³¹—C(O)R³², C(O)—NR³¹R³², SR³¹, halogen, CN, SiR$^{Siv}$R$^{Siw}$R$^{Six}$ and OH, and wherein

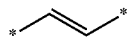

can be substituted with one or two substituents R⁴ at each occurrence selected from the group consisting of C₁₋₃₀-alkyl, C₂₋₃₀-alkenyl, C₂₋₃₀-alkynyl, C₅₋₁₂-cycloalkyl, C₆₋₁₈-aryl and 5 to 16 membered heteroaryl, C(O)—R⁴¹, C(O)—NR⁴¹R⁴², C(O)—OR⁴¹ and CN, wherein R³¹, R³², R⁴¹ and R⁴² are independently from each other and at each occurrence selected from the group consisting of H, C₁₋₃₀-alkyl, C₂₋₃₀-alkenyl, C₂₋₃₀-alkynyl, C₅₋₁₂-cycloalkyl, C₆₋₁₈-aryl and 5 to 20 membered heteroaryl, and wherein C₁₋₃₀-alkyl, C₂₋₃₀-alkenyl and C₂₋₃₀-alkynyl can be substituted with one to ten substituents independently selected from the group consisting of C₅₋₈-cycloalkyl, C₆₋₁₄-aryl, 5 to 14 membered heteroaryl, OR$^i$, OC(O)—R$^i$, C(O)—OR$^i$, C(O)—R$^j$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO₂; and at least two CH₂-groups, but not adjacent CH₂-groups of C₁₋₃₀-alkyl, C₂₋₃₀-alkenyl and C₂₋₃₀-alkynyl can be replaced by O or S, C₅₋₁₂-cycloalkyl can be substituted with one to six substituents independently selected from the group consisting of C₁₋₂₀-alkyl, C₂₋₂₀-alkenyl and C₂₋₂₀-alkynyl, C₅₋₈-cycloalkyl, C₆₋₁₄-aryl, 5 to 14 membered heteroaryl, OR$^i$, OC(O)—R$^i$, C(O)—OR$^i$, C(O)—R$^j$, NR$^i$R$^j$, NR$^i$—C(O)R, C(O)—NR$^i$R$^j$, N[C(O)R$^i$][C(O)R$^j$], SR$^i$, halogen, CN, SiR$^{Siv}$R$^{Siw}$R$^{Six}$ and NO₂; and one or two CH₂-groups, but not adjacent CH₂-groups, of C₅₋₁₂-cycloalkyl can be replaced by O, S, OC(O), CO, NR$^i$ or NR$^i$—CO, C₆₋₁₈-aryl and 5 to 20 membered heteroaryl can be substituted with one to six substituents independently selected from the group consisting of C₁₋₂₀-alkyl, C₂₋₂₀-alkenyl, C₂₋₂₀-alkynyl, C₅₋₈-cycloalkyl, C₆₋₁₄-aryl, 5 to 14 membered heteroaryl, OR$^i$, OC(O)—R$^j$, C(O)—OR$^i$, C(O)—R$^i$, NR$^i$R$^j$, NR$^i$—C(O)R, C(O)—NR$^i$R$^j$, N[C(O)R$^i$][C(O)R], SR$^i$, halogen, CN, SiR$^{Siv}$R$^{Siw}$R$^{Six}$ and NO₂, wherein R$^{Siv}$, R$^{Siw}$, R$^{Six}$ are independently from each other selected from the group consisting of H, C₁₋₂₀-alkyl, C₂₋₂₀-alkenyl, C₂₋₂₀-alkynyl, C₅₋₆-cycloalkyl, phenyl and O—Si(CH₃)₃, R$^i$ and R$^j$ are independently selected from the group consisting of H, C₁₋₂₀-alkyl, C₂₋₂₀-alkenyl, C₂₋₂₀-alkynyl, C₅₋₈-cycloalkyl, C₆₋₁₄-aryl, and 5 to 14 membered heteroaryl, wherein C₁₋₂₀-alkyl, C₂₋₂₀-alkenyl and C₂₋₂₀-alkynyl can be substituted with one to five substituents selected from the group consisting of C₅₋₆-cycloalkyl, C₆₋₁₀-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO₂;

C₅₋₈-cycloalkyl can be substituted with one to five substituents selected from the group consisting of C₁₋₁₀-alkyl, C₂₋₁₀-alkenyl, C₂₋₁₀-alkynyl, C₅₋₆-cycloalkyl, C₆₋₁₀-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO₂;

C₆₋₁₄-aryl and 5 to 14 membered heteroaryl can be substituted with one to five substituents independently selected from the group consisting of C₁₋₁₀-alkyl, C₂₋₁₀-alkenyl, C₂₋₁₀-alkynyl, C₅₋₆-cycloalkyl, C₆₋₁₀-aryl, 5 to 10 membered heteroaryl, OR$^k$, OC(O)—R, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO₂;

wherein

R$^k$ and R$^l$ are independently selected from the group consisting of H, C₁₋₁₀-alkyl, C₂₋₁₀-alkenyl and C₂₋₁₀-alkynyl, wherein C₁₋₁₀-alkyl, C₂₋₁₀-alkenyl and C₂₋₁₀-alkynyl can be substituted with one to five substituents selected from the group consisting of halogen, CN and NO₂.

In even more preferred polymers comprising at least one unit of formula (1)

X¹ is S, and X² and X³ are NR¹,

A is

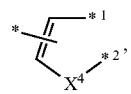

wherein

X⁴ is S or NR¹, and

A1 can be substituted with one substituent R²,

B is

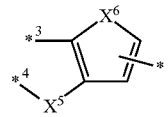

wherein
X⁵ and X⁶ are independently from each other S or NR¹, and
B2 can be substituted with one substituent R²,
R¹ is at each occurrence selected from the group consisting of $C_{1-36}$-alkyl, $C_{2-36}$-alkenyl and $C_{2-36}$-alkynyl,
wherein
$C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, $-O-Si(R^{Sia})(R^{Sib})(R^{Sic})$, halogen, and CN; and at least two $CH_2$-groups, but not adjacent $CH_2$-groups, of $C_{1-36}$-alkyl, $C_{2-36}$-alkenyl and $C_{2-36}$-alkynyl can be replaced by O or S,
wherein
$R^a$ and $R^b$ are independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl
$R^{Sia}$, $R^{Sib}$ and $R^{Sic}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, $-[O-SiR^{Sid}R^{Sie}]_o-R^{Sif}$
wherein
o is an integer from 1 to 50,
$R^{Sid}$, $R^{Sie}$, $R^{Sif}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $-[O-SiR^{Sig}R^{Sih}]_p R^{Sii}$,
wherein
p is an integer from 1 to 50,
$R^{Sig}$, $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $O-Si(CH_3)_3$,
$R^5$, $R^6$, $R^{50}$, $R^{60}$, $R^{500}$ and $R^{600}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, and 5 to 10 membered heteroaryl,
$C_{1-20}$-alkyl, $C_{2-20}$-alkenyl and $C_{2-20}$-alkynyl can be substituted with one to ten substituents selected from the group consisting of halogen and CN,
R² is at each occurrence selected from the group consisting of unsubstituted $C_{1-30}$-alkyl and halogen,
n is 0 or 1,
m is 0, 1 or 2, and
L¹ and L² are independently from each other and at each occurrence selected from the group consisting of 5 to 20 membered heteroarylene, and

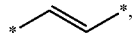

wherein 5 to 20 membered heteroarylene is selected from the group consisting of

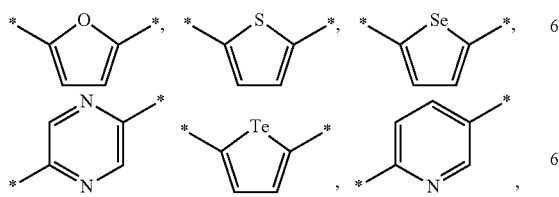

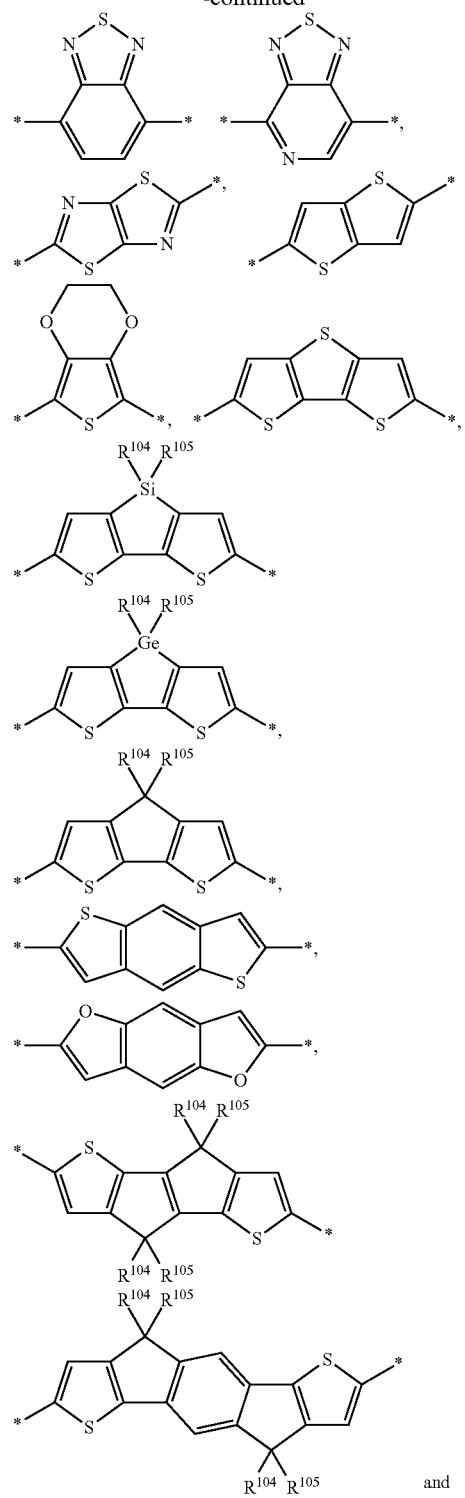

and

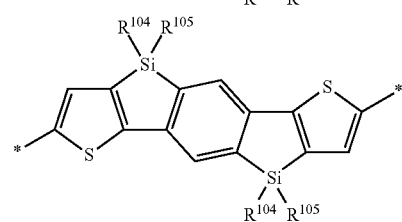

wherein

R$^{104}$ and R$^{105}$ are independently and at each occurrence selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, or R$^{104}$ and R$^{105}$, if attached to the same atom, together with the atom, to which they are attached, form a 5 to 12 membered ring system, wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;

5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^s$, OC(O)—R$^t$, C(O)—OR$^s$, C(O)—R$^s$, NR$^s$R$^t$, NR$^s$—C(O)R$^t$, C(O)—NR$^s$R$^t$, N[C(O)R$^s$][C(O)R$^t$], SR$^s$, halogen, CN, and NO$_2$;

wherein

R$^s$ and R$^t$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, wherein 5 to 20 membered heteroarylene can be substituted with one to six substituents R$^3$ at each occurrence selected from the group consisting of C$_{1-30}$-alkyl and halogen, and wherein

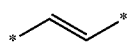

can be substituted with one or two substituents R$^4$ at each occurrence selected from the group consisting of C$_{1-30}$-alkyl, C(O)—R$^{41}$, C(O)—OR$^{41}$ and CN, wherein R$^{41}$ is at each occurrence C$_{1-30}$-alkyl.

In most preferred polymers comprising at least one unit of formula (1)

X$^1$ is S, and X$^2$ and X$^3$ are NR$^1$,

A is

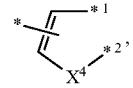     A1 wherein

X$^4$ is S and

A1 is not substituted,

B is

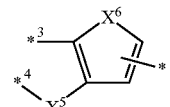     B2 wherein

X$^5$ and X$^6$ are S, and

B2 is not substituted,

R$^1$ is at each occurrence unsubstituted C$_{1-36}$-alkyl, n is 0, m is 0, 1 or 2, and L$^1$ and L$^2$ are independently from each other and at each occurrence 5 to 20 membered heteroarylene, wherein 5 to 20 membered heteroarylene is selected from the group consisting of

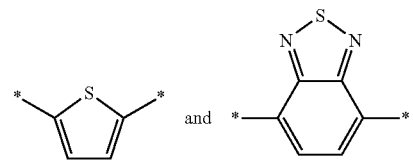 [SMILES: *c1ccc(*)s1 ; *c1ccc(*)c2nsnc12]

wherein 5 to 20 membered heteroarylene is unsubstituted.

Particular preferred polymers of the present invention comprise at least one unit of formula (1b)

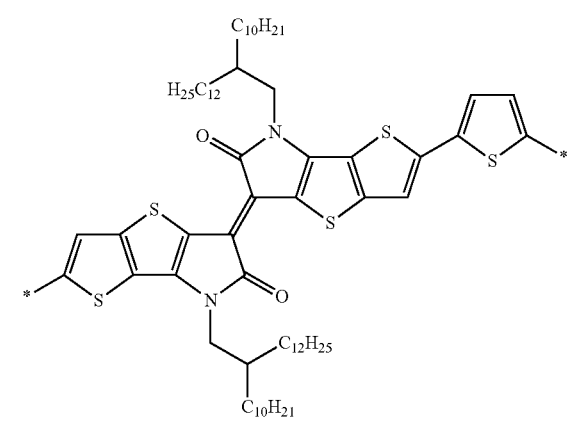

-continued (1a)

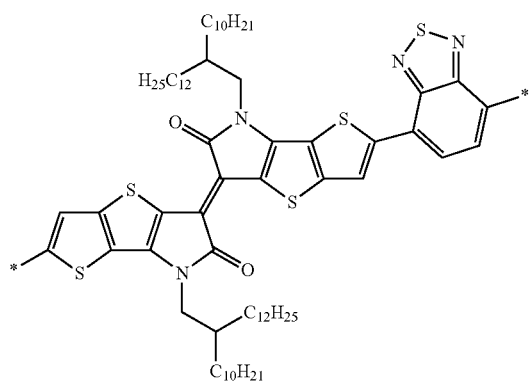

or (1c)

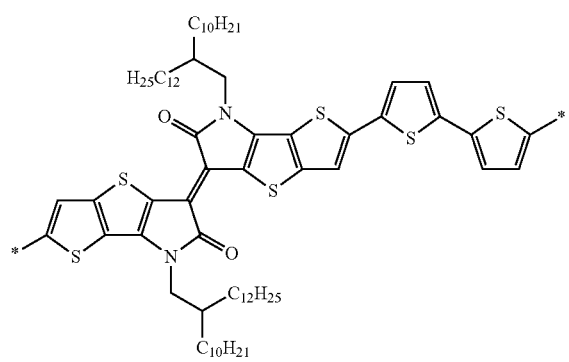

The polymers of the present invention have preferably a weight average molecular weight ($M_w$) of 1 to 10000 kDa and a number average molecular weight ($M_n$) of 1 to 10000 kDa. The polymers of the present invention have more preferably a weight average molecular weight ($M_w$) of 1 to 1000 kDa and a number average molecular weight ($M_n$) of 1 to 100 kDa. The polymers of the present invention have most preferably a weight average molecular weight ($M_w$) of 10 to 100 kDa and a number average molecular weight ($M_n$) of 5 to 60 kDa. The weight average molecular weight ($M_w$) and the number average molecular weight ($M_n$) can be determined by gel permeation chromatography (GPC) at 80° C. using chlorobenzene as eluent and a polystyrene as standard.

The polymers of the present invention can be prepared by methods known in the art.

For examples, polymers of the present invention comprising at least one unit of formula (1), wherein n is 0 and which are of formula (1-I)

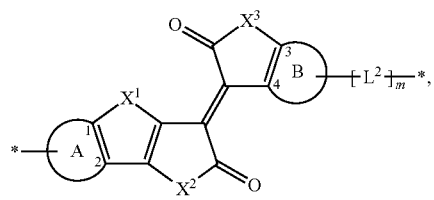

(1-I)

wherein
$X^1$, $X^2$ and $X^3$ are independently from each other O, S or $NR^1$, A is selected from the group consisting of

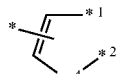 A1

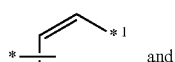 and A2

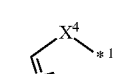 , A3

B is selected from the group consisting of

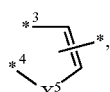 , B1

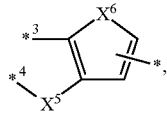 , B2

 , B3

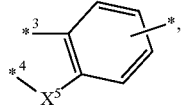 , B4

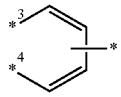 , B5

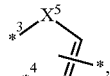 and B6

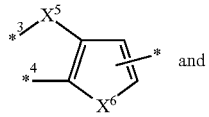 B7 wherein
$X^4$, $X^5$ and $X^6$ are independently from each other O, S or $NR^1$,
A1, A2, A3, B1, B2, B3, B4, B5, B6 or B7 can be substituted with one to three substituents $R^2$,
$R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, a 5 to 20 membered heteroaryl, $C(O)$—$C_{1-100}$-alkyl, $C(O)$—$C_{5-12}$-cycloalkyl and $C(O)$—$OC_{1-100}$-alkyl, wherein $C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$; and at least two $CH_2$-groups, but not adjacent $CH_2$-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—Si$(R^{Sia})(R^{Sib})(R^{Sic})$, halogen, CN, and $NO_2$; and one or two $CH_2$-groups, but not adjacent $CH_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sid}R^{Sie}]_o$—$R^{Sif}$, $NR^5R^6$, halogen and O—C(O)—$R^5$, wherein o is an integer from 1 to 50, $R^{Sid}$, $R^{Sie}$, $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sig}R^{Sih}]_p R^{Sii}$, $NR^{50}R^{60}$, halogen and O—C(O)—$R^{50}$;

wherein p is an integer from 1 to 50, $R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{500}R^{600}$, halogen and O—C(O)—$R^{500}$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN, and $NO_2$; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN, and $NO_2$; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN and $NO_2$;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sim}R^{Sin}]q$-$R^{Sio}$, $NR^7R^8$, halogen, and O—C(O)—$R^7$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sip}R^{Siq}]r$-$R^{Sir}$, $NR^{70}R^{80}$, halogen, and O—C(O)—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—C(O)—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen, CN and $NO_2$, $R^2$ is at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl, 5 to 20 membered heteroaryl, $OR^{21}$, $OC(O)$—$R^{21}$, $C(O)$—$OR^{21}$, $C(O)$—$R^{21}$, $NR^{21}R^{22}$, $NR^{21}$—$C(O)R^{22}$, $C(O)$—$NR^{21}R^{22}$, $N[C(O)R^{21}][C(O)R^{22}]$, $SR^{21}$, halogen, CN, $SiR^{Sis}R^{Sit}R^{Siu}$ and OH, wherein $R^{21}$ and $R^{22}$ and are independently selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and one or two $CH_2$-groups, but not adjacent $CH_2$-groups, of $C_{5-12}$-cycloalkyl can be replaced by O, S, OC(O), CO, $NR^e$ or $NR^e$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$, wherein $R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR$—$C(O)R^h$, $C(O)$—$NR^gR^h$, $N[C(O)R^g][C(O)R^h]$, $SR^g$, halogen, CN, and $NO_2$;

wherein $R^g$ and $R^h$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$, m is 0, 1, 2 or 3, and $L^2$ is at each occurrence selected from the group consisting of $C_{6-18}$-arylene, 5 to 20 membered heteroarylene,

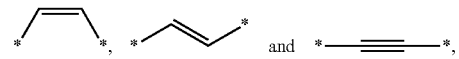

wherein $C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, $NR^{31}$—$C(O)R^{32}$, $C(O)$—$NR^{31}R^{32}$, $N[C(O)R^{31}][C(O)R^{32}]$, $SR^{31}$ halogen, CN, $SiR^{Siv}R^{Siw}R^{Six}$ and OH, and wherein

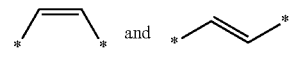

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to membered heteroaryl, $C(O)$—$R^{41}$, $C(O)$—$NR^{41}R^{42}$, $C(O)$—$OR^{41}$ and CN, wherein $R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and wherein $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, OR$^i$, OC(O)—R$^j$, C(O)—OR$^i$, C(O)—R$^j$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^j$, NR$^i$R$^j$, NR$^i$—C(O)R, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of C$_{5-12}$-cycloalkyl can be replaced by O, S, OC(O), CO, NR$^i$ or NR$^i$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^j$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$, wherein R$^{Siv}$, R$^{Siw}$, R$^{Six}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, R$^i$ and R$^j$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

wherein

R$^k$ and R$^l$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, can be prepared by treating a compound of formula (2)

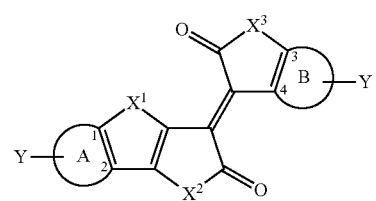

(2)

wherein Y is at each occurrence I, Br, Cl or O—S(O)$_2$CF$_3$, and X$^1$, X$^2$, X$^3$, A and B are as defined above, with m mol equivalents of a compound of formula (3)

$$Z^a\text{-}L^2\text{-}Z^b \quad (3)$$

wherein

L$^2$ is as defined for the compound of formula (1-I), and Z$^a$ and Z$^b$ are independently selected from the group consisting of B(OZ$^1$)(OZ$^2$), SnZ$^1$Z$^2$Z$^3$,

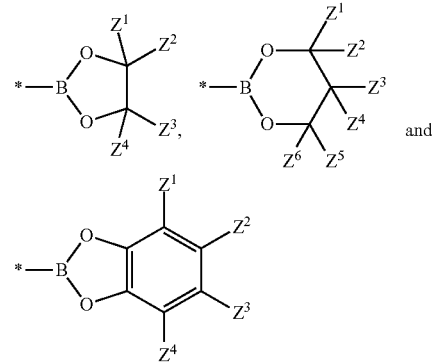

wherein Z$^1$, Z$^2$, Z$^3$, Z$^4$, Z$^5$ and Z$^6$ are independently from each other and at each occurrence H or C$_{1-4}$-alkyl.

For examples, polymers of the present invention comprising at least one unit of formula (1), wherein n and m are 0 and which are of formula (1-II)

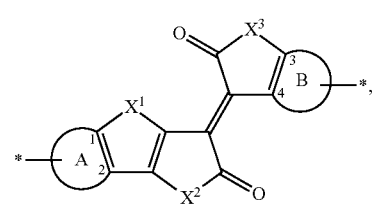

(1-II)

wherein

X$^1$, X$^2$ and X$^3$ are independently from each other O, S or NR$^1$,

A is selected from the group consisting of

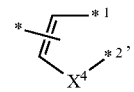

A1

-continued

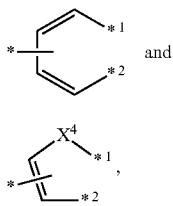

B is selected from the group consisting of

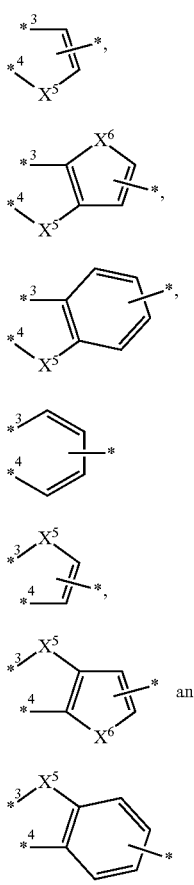

wherein
X⁴, X⁵ and X⁶ are independently from each other O, S or NR¹,
A1, A2, A3, B1, B2, B3, B4, B5, B6 or B7 can be substituted with one to three substituents R²,
R¹ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, a 5 to 20 membered heteroaryl, C(O)—$C_{1-100}$-alkyl, C(O)—$C_{5-12}$-cycloalkyl and C(O)—$OC_{1-100}$-alkyl,
wherein
$C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, OR$^a$, OC(O)—R$^a$, C(O)—OR$^a$, C(O)—R$^a$, NR$^a$R$^b$, NR$^a$—C(O)R$^b$, C(O)—NR$^a$R$^b$, N[C(O)R$^a$][C(O)R$^b$], SR$^a$, Si(R$^{Sia}$)(R$^{Sib}$)(R$^{Sic}$), —O—Si(R$^{Sia}$)(R$^{Sib}$)(R$^{Sic}$), halogen, CN, and NO₂; and at least two CH₂-groups, but not adjacent CH₂-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, OR$^a$, OC(O)—R$^a$, C(O)—OR$^a$, C(O)—R$^a$, NR$^a$R$^b$, NR$^a$—C(O)R$^b$, C(O)—NR$^a$R$^b$, N[C(O)R$^a$][C(O)R$^b$], SR$^a$, Si(R$^{Sia}$)(R$^{Sib}$)(R$^{Sic}$), —O—Si(R$^{Sia}$)(R$^{Sib}$)(R$^{Sic}$), halogen, CN, and NO₂; and one or two CH₂-groups, but not adjacent CH₂-groups, of $C_{5-12}$-cycloalkyl can be replaced by O, S, OC(O), CO, NR$^a$ or NR$^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, OR$^a$, OC(O)—R$^a$, C(O)—OR$^a$, C(O)—R$^a$, NR$^a$R$^b$, NR$^a$—C(O)R$^b$, C(O)—NR$^a$R$^b$, N[C(O)R$^a$][C(O)R$^b$], SR$^a$, Si(R$^{Sia}$)(R$^{Sib}$)(R$^{Sic}$), —O—Si(R$^{Sia}$)(R$^{Sib}$)(R$^{Sic}$), halogen, CN, and NO₂,
wherein
R$^a$ and R$^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl,
R$^{Sia}$, R$^{Sib}$ and R$^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—SiR$^{Sid}$R$^{Sie}$]$_o$—R$^{Sif}$, NR⁵R⁶, halogen and O—C(O)—R⁵,
wherein
o is an integer from 1 to 50,
R$^{Sid}$, R$^{Sie}$, R$^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—SiR$^{Sig}$R$^{Sih}$]$_p$R$^{Sii}$, NR⁵⁰R⁶⁰, halogen and O—C(O)—R⁵⁰;
wherein
p is an integer from 1 to 50,
R$^{Sig}$ R$^{Sih}$, R$^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{1-61}$-aryl, O-5 to 10 membered heteroaryl, O—Si(CH₃)₃, NR⁵⁰⁰R⁶⁰⁰, halogen and O—C(O)—R⁵⁰⁰,
R⁵, R⁶, R⁵⁰, R⁶⁰, R⁵⁰⁰ and R⁶⁰⁰ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl,
$C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, OR$^c$, OC(O)—R$^c$, C(O)—OR$^c$, C(O)—R$^c$, NR$^c$R$^d$, NR$^c$—C(O)R$^d$, C(O)—NR$^c$R$^d$, N[C(O)R$^c$][C(O)R$^d$], SR$^c$, Si(R$^{Sij}$)(R$^{Sik}$)(R$^{Sil}$), —O—Si(R$^{Sij}$)(R$^{Sik}$)(R$^{Sil}$), halogen, CN, and NO$_2$; and at least two CH$_2$-groups, but not adjacent CH$_2$-groups, of C$_{1-60}$-alkyl, C$_{2-60}$-alkenyl and C$_{2-60}$-alkynyl can be replaced by O or S, C$_{5-8}$-cycloalkyl can be substituted with one to five substituents selected from the group consisting of C$_{1-30}$-alkyl, C$_{2-30}$-alkenyl, C$_{2-30}$-alkynyl, C$_{5-6}$-cycloalkyl, C$_{6-10}$-aryl, OR$^c$, OC(O)—R$^c$, C(O)—OR$^c$, C(O)—R$^c$, NR$^c$R$^d$, NR$^c$—C(O)R$^d$, C(O)—NR$^c$R$^d$, N[C(O)R$^c$][C(O)R$^d$], SR$^c$, Si(R$^{Sij}$)(R$^{Sik}$)(R$^{Sil}$), —O—Si(R$^{Sij}$)(R$^{Sik}$)(R$^{Sil}$), halogen, CN, and NO$_2$; and one or two CH$_2$-groups, but not adjacent CH$_2$-groups, of C$_{5-8}$-cycloalkyl can be replaced by O, S, OC(O), CO, NR$^c$ or NR$^c$—CO, C$_{6-14}$-aryl and 5 to 14 membered heteroaryl can be substituted with one to five substituents independently selected from the group consisting of C$_{1-30}$-alkyl, C$_{2-30}$-alkenyl, C$_{2-30}$-alkynyl, C$_{5-6}$-cycloalkyl, C$_{6-10}$-aryl, OR$^c$, OC(O)—R$^c$, C(O)—OR$^c$, C(O)—R$^c$, NR$^c$R$^d$, NR—C(O)R$^d$, C(O)—NR$^c$R$^d$, N[C(O)R$^c$][C(O)R$^d$], SR$^c$, Si(R$^{Sij}$)(R$^{Sik}$)(R$^{Sil}$), —O—Si(R$^{Sij}$)(R$^{Sik}$)(R$^{Sil}$), halogen, CN and NO$_2$;

wherein

R$^c$ and R$^d$ are independently selected from the group consisting of H, C$_{1-30}$-alkyl, C$_{2-30}$-alkenyl and C$_{2-30}$-alkynyl, R$^{Sij}$, R$^{Sik}$ and R$^{Sil}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, 5 to 10 membered heteroaryl, O—C$_{1-30}$-alkyl, O—C$_{2-30}$-alkenyl, O—C$_{2-30}$-alkynyl, O—C$_{5-6}$-cycloalkyl, O—C$_{6-10}$-aryl, O-5 to 10 membered heteroaryl, —[O—SiR$^{Sim}$R$^{Sin}$]q-R$^{Sio}$, NR$^7$R$^8$, halogen, and O—C(O)—R$^7$, wherein q is an integer from 1 to 50, R$^{Sim}$, R$^{Sin}$, R$^{Sio}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, 5 to 10 membered heteroaryl, O—C$_{1-30}$-alkyl, O—C$_{2-30}$-alkenyl, O—C$_{2-30}$-alkynyl, O—C$_{5-6}$-cycloalkyl, O—C$_{6-10}$-aryl, O-5 to 10 membered heteroaryl, —[O—SiR$^{Sip}$R$^{Siq}$]r-R$^{Sir}$, NR$^{70}$R$^{80}$, halogen, and O—C(O)—R$^{70}$;

wherein r is an integer from 1 to 50,

R$^{Sip}$, R$^{Siq}$, R$^{Sir}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, 5 to 10 membered heteroaryl, O—C$_{1-30}$-alkyl, O—C$_{2-30}$-alkenyl, O—C$_{2-30}$-alkynyl, O—C$_{5-6}$-cycloalkyl, O—C$_{6-10}$-aryl, O-5 to 10 membered heteroaryl, O—Si(CH$_3$)$_3$, NR$^{700}$R$^{800}$, halogen and O—C(O)—R$^{700}$, R$^7$, R$^8$, R$^{70}$, R$^{80}$, R$^{700}$ and R$^{800}$ are independently selected from the group consisting of H, C$_{1-30}$-alkyl, C$_{2-30}$-alkenyl, C$_{2-30}$-alkynyl, C$_{5-6}$-cycloalkyl, C$_{6-10}$-aryl, and 5 to 10 membered heteroaryl, C$_{1-30}$-alkyl, C$_{2-30}$-alkenyl and C$_{2-30}$-alkynyl can be substituted with one to ten substituents selected from the group consisting of halogen, CN and NO$_2$, and R$^2$ is at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl, 5 to 20 membered heteroaryl, OR$^{21}$, OC(O)—R$^{21}$, C(O)—OR$^{21}$, C(O)—R$^{21}$, NR$^{21}$R$^{22}$, NR$^{21}$—C(O)R$^{22}$, C(O)—NR$^{21}$R$^{22}$, N[C(O)R$^{21}$][C(O)R$^{22}$], SR$^{21}$, halogen, CN, SiR$^{Sis}$R$^{Sit}$R$^{Siu}$ and OH, wherein R$^{21}$ and R$^{22}$ and are independently selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and C$_{1-30}$-alkyl, C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and at least two CH$_2$-groups, but not adjacent CH$_2$-groups, of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and one or two CH$_2$-groups, but not adjacent CH$_2$-groups, of C$_{5-12}$-cycloalkyl can be replaced by O, S, OC(O), CO, NR$^e$ or NR$^e$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$, wherein R$^{Sis}$, R$^{Sit}$ and R$^{Siu}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, R$^e$ and R$^f$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR—C(O)R$^h$, C(O)—NR$^g$R$^h$, N[C(O)R$^g$][C(O)R$^h$], SR$^g$, halogen, CN, and NO$_2$;

wherein

R$^g$ and R$^h$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, can be prepared by treating a compound of formula (2)

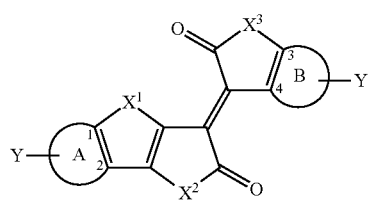

(2)

wherein Y is at each occurrence I, Br, Cl or O—S(O)$_2$CF$_3$, and X$^1$, X$^2$, X$^3$, A and B are as defined above, with a compound of formula (7)

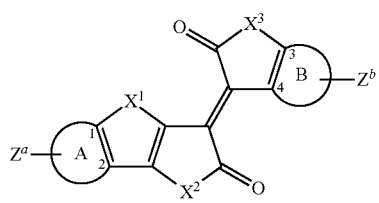

(7)

wherein

X$^1$, X$^2$, X$^3$, A and B are as defined for the compound of formula (1-II), and Z$^a$ and Z$^b$ are independently selected from the group consisting of B(OZ$^1$)(OZ$^2$), SnZ$^1$Z$^2$Z$^3$,

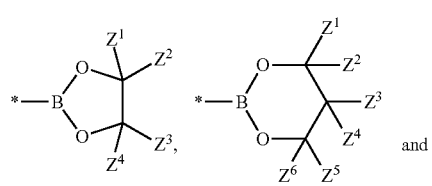

and

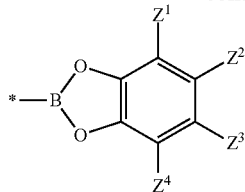

wherein Z$^1$, Z$^2$, Z$^3$, Z$^4$, Z$^5$ and Z$^6$ are independently from each other and at each occurrence H or C$_{1-4}$-alkyl.

When Z$^a$ and Z$^b$ are independently selected from the group consisting of B(OZ$^1$)(OZ$^2$),

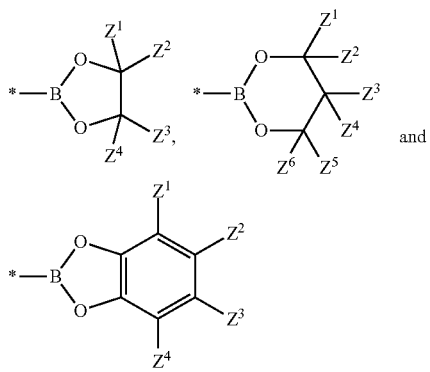

and wherein Z$^1$, Z$^2$, Z$^3$, Z$^4$, Z$^5$ and Z$^6$ are independently from each other and at each occurrence H or C$_{1-4}$-alkyl, the reaction is usually performed in the presence of a catalyst, preferably a Pd catalyst such as Pd(P(Ph)$_3$)$_4$, Pd(OAc)$_2$ and Pd$_2$(dba)$_3$, and a base such as K$_3$PO$_4$, Na$_2$CO$_3$, K$_2$CO$_3$, LiOH and NaOMe. Depending on the Pd catalyst, the reaction may also require the presence of a phosphine ligand such as P(Ph)$_3$, P(o-tolyl)$_3$ and P(tert-Bu)$_3$. The reaction is also usually performed at elevated temperatures, such as at temperatures in the range of 40 to 250° C., preferably 60 to 200° C. The reaction can be performed in the presence of a suitable solvent such as tetrahydro-furan, toluene or chlorobenzene. The reaction is usually performed under inert gas.

When Z$^a$ and Z$^b$ are independently SnZ$^1$Z$^2$Z$^3$, wherein Z$^1$, Z$^2$ and Z$^3$ are independently from each other C$_{1-4}$-alkyl, the reaction is usually performed in the presence of a catalyst, preferably a Pd catalyst such as Pd(P(Ph)$_3$)$_4$ and Pd$_2$(dba)$_3$. Depending on the Pd catalyst, the reaction may also require the presence of a phosphine ligand such as P(Ph)$_3$, P(o-tolyl)$_3$ and P(tert-Bu)$_3$. The reaction is also usually performed at elevated temperatures, such as at temperatures in the range of 40 to 250° C., preferably 60 to 200° C. The reaction can be performed in the presence of a suitable solvent such as toluene or chlorobenzene. The reaction is usually performed under inert gas.

The compound of formula (2) can be prepared by methods known in the art.

For examples, compounds of formula (2), wherein $X^1$ is S, and $X^2$ and $X^3$ are $NR^1$,
A is

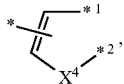  A1 wherein
$X^4$ is S and
A1 is not substituted,
B is

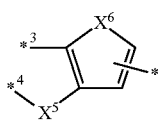  B2 wherein
$X^5$ and $X^6$ are S, and
B2 is not substituted, and
$R^1$ is at each occurrence unsubstituted $C_{1-36}$-alkyl,
and which are of formula (2-I)

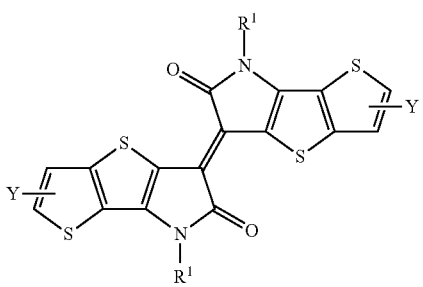  (2-I)

wherein Y is I, Br, Cl or O-triflate, and $R^1$ is at each occurrence unsubstituted $C_{1-36}$-alkyl,
can be prepared by treating a compound of formula (3)

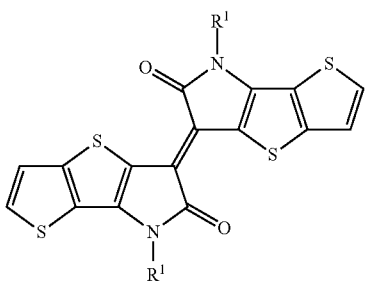  (3)

wherein $R^1$ is at each occurrence unsubstituted $C_{1-36}$-alkyl,
with an Y-donor.

For example, when Y is Br, the Y-donor can be N-bromosuccinimide. When using N-bromosuccinimide as Y-donor, the reaction can be performed at 0° C. in the presence of THF as solvent.

A compound of formula (3), wherein $R^1$ is at each occurrence unsubstituted $C_{1-36}$-alkyl, can be prepared by treating a compound of formula (4)

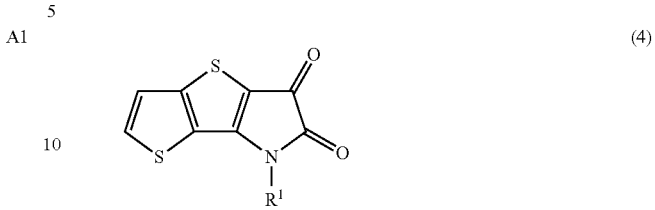  (4)

wherein $R^1$ is at each occurrence unsubstituted $C_{1-36}$-alkyl, with Lawesson's reagent.

The reaction is usually performed in a suitable solvent such as o-xylene and at a suitable temperature such as in the range of 40 to 100° C.

A compound of formula (4), wherein $R^1$ is at each occurrence unsubstituted $C_{1-36}$-alkyl, can be prepared by treating a compound of formula (5)

  (5)

wherein $R^1$ is at each occurrence unsubstituted $C_{1-36}$-alkyl, with dioxalyl chloride.

The reaction is usually performed in a suitable solvent such as DCM and at a suitable temperature such as in the range of −40 to 0° C.

The compound of formula (5), wherein $R^1$ is at each occurrence unsubstituted $C_{1-36}$-alkyl, can be prepared by treating a compound of formula (6)

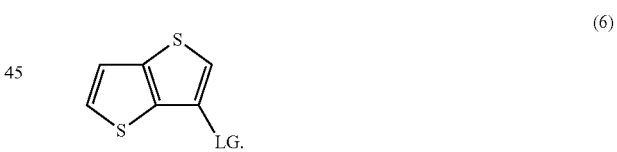  (6)

wherein LG is I, Br, Cl or F, with $HNR^1$.

The reaction is usually performed in the presence of a catalyst, preferably a copper catalyst.

The reaction is usually performed at elevated temperatures such in the range of 40 to 160° C.

Also part of the invention are intermediates of formula

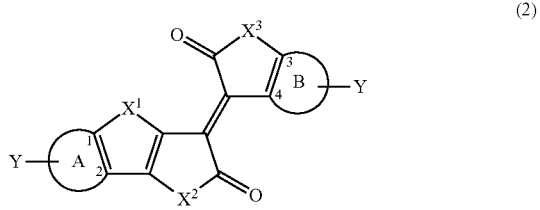  (2)

wherein
X¹, X² and X³ are independently from each other O, S or NR¹,
A is selected from the group consisting of

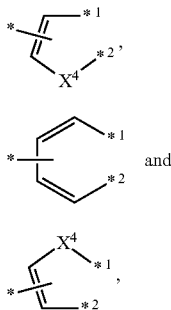

A1

A2

A3

B is selected from the group consisting of

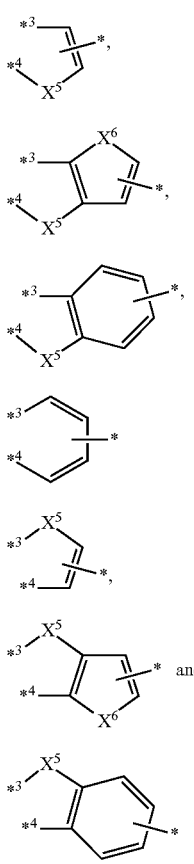

B1

B2

B3

B4

B5

B6

B7 wherein
X⁴, X⁵ and X⁶ are independently from each other O, S or NR¹,
A1, A2, A3, B1, B2, B3, B4, B5, B6 or B7 can be substituted with one to three substituents R²,
R¹ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, a 5 to 20 membered heteroaryl, C(O)—$C_{1-100}$-alkyl, C(O)—$C_{5-12}$-cycloalkyl and C(O)—$OC_{1-100}$-alkyl, wherein
$C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, OC(O)—$R^a$, C(O)—$OR^a$, C(O)—$R^a$, $NR^aR^b$, $NR^a$—C(O)$R^b$, C(O)—$NR^aR^b$, N[C(O)$R^a$][C(O)$R^b$], $SR^a$, Si($R^{Sia}$)($R^{Sib}$)($R^{Sic}$), —O—Si($R^{Sia}$)($R^{Sib}$)($R^{Sic}$), halogen, CN, and $NO_2$; and at least two $CH_2$-groups, but not adjacent $CH_2$-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, OC(O)—$R^a$, C(O)—$OR^a$, C(O)—$R^a$, $NR^aR^b$, $NR^a$—C(O)$R^b$, C(O)—$NR^aR^b$, N[C(O)$R^a$][C(O)$R^b$], $SR^a$, Si($R^{Sia}$)($R^{Sib}$)($R^{Sic}$), —O—Si($R^{Sia}$)($R^{Sib}$)($R^{Sic}$), halogen, CN, and $NO_2$; and one or two $CH_2$-groups, but not adjacent $CH_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, OC(O)—$R^a$, C(O)—$OR^a$, C(O)—$R^a$, $NR^aR^b$, $NR^a$—C(O)$R^b$, C(O)—$NR^aR^b$, N[C(O)$R^a$][C(O)$R^b$], $SR^a$, Si($R^{Sia}$)($R^{Sib}$)($R^{Sic}$), —O—Si($R^{Sia}$)($R^{Sib}$)($R^{Sic}$), halogen, CN, and $NO_2$, wherein
$R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sid}R^{Sie}$]$_o$—$R^{Sif}$, $NR^5R^6$, halogen and O—C(O)—$R^5$, wherein
o is an integer from 1 to 50,
$R^{Sid}$, $R^{Sie}$, $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sig}R^{Sih}$]$_p$—$R^{Sii}$, $NR^{50}R^{60}$, halogen and O—C(O)—$R^{50}$;

wherein
p is an integer from 1 to 50,
$R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—Si($CH_3$)$_3$, $NR^{500}R^{600}$, halogen and O—C(O)—$R^{500}$, $R^5$, $R^6$, $R^{50}$, $R^{60}$, $R^{500}$ and $R^{600}$ are independently selected from the group consisting of H, $C_{1-60}$- alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN, and $NO_2$; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN, and $NO_2$; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN and $NO_2$;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sim}R^{Sin}]_q$-$R^{Sio}$, $NR^7R^8$, halogen, and O—C(O)—$R^7$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—$SiR^{Sip}R^{Siq}]_r$$R^{Sir}$, $NR^{70}R^{80}$, halogen, and O—C(O)—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—C(O)—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen, CN and $NO_2$, $R^2$ is at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl, 5 to 20 membered heteroaryl, $OR^{21}$, $OC(O)$—$R^{21}$, $C(O)$—$OR^{21}$, $C(O)$—$R^{21}$, $NR^{21}R^{22}$, $NR^{21}$—$C(O)R^{22}$, $C(O)$—$NR^{21}R^{22}$, $N[C(O)R^{21}][C(O)R^{22}]$, $SR^{21}$, halogen, CN, $SiR^{Sis}R^{Sit}R^{Siu}$ and OH, wherein $R^{21}$ and $R^{22}$ and are independently selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and one or two $CH_2$-groups, but not adjacent $CH_2$-groups, of $C_{5-12}$-cycloalkyl can be replaced by O, S, OC(O), CO, $NR^e$ or $NR^e$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$, wherein $R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)—R^g$, $C(O)—OR^g$, $C(O)—R^g$, $NR^gR^h$, $NR^g—C(O)R^h$, $C(O)—NR^gR^h$, $N[C(O)R^g][C(O)R^h]$, $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)—R^g$, $C(O)—OR^g$, $C(O)—R^g$, $NR^gR^h$, $NR^g—C(O)R^h$, $C(O)—NR^gR^h$, $N[C(O)R^g][C(O)R^h]$, $SR^g$, halogen, CN, and $NO_2$;

wherein $R^g$ and $R^h$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$, and Y is at each occurrence I, Br, Cl or $O—S(O)_2CF_3$.

In preferred intermediates of formula (2)
$X^1$, $X^2$ and $X^3$ are independently from each other S or $NR^1$,
A is

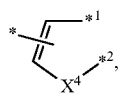

A1 wherein
$X^4$ is S or $NR^1$, and
A1 can be substituted with one substituent $R^2$,
B is selected from the group consisting of

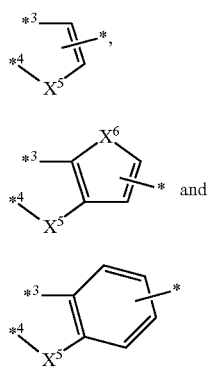

B1

B2

B3 wherein
$X^5$ and $X^6$ are independently from each other S or $NR^1$, and
B1, B2 and B3 can be substituted with one to three substituents $R^2$,
$R^1$ is at each occurrence selected from the group consisting of $C_{1-50}$-alkyl, $C_{2-50}$-alkenyl and $C_{2-50}$-alkynyl, wherein
$C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, $—O—Si(R^{Sia})(R^{Sib})(R^{Sic})$, halogen, and CN; and at least two $CH_2$-groups, but not adjacent $CH_2$-groups, of $C_{1-50}$-alkyl, $C_{2-50}$-alkenyl and $C_{2-50}$-alkynyl can be replaced by O or S, wherein
$R^a$ and $R^b$ are independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl, $R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, $—[O—SiR^{Sid}R^{Sie}]_o—R^{Sif}$, wherein
o is an integer from 1 to 50, $R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, $—[O—SiR^{Sig}R^{Sih}]_p R^{Sii}$, wherein
p is an integer from 1 to 50, $R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, $O—Si(CH_3)_3$, $R^5$, $R^6$, $R^{50}$, $R^{60}$, $R^{500}$ and $R^{600}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN, $R^2$ is at each occurrence selected from the group consisting of unsubstituted $C_{1-30}$-alkyl and halogen, and Y is at each occurrence I, Br, Cl or $O—S(O)_2CF_3$.

In more preferred intermediates of formula (2)
$X^1$ is S, and $X^2$ and $X^3$ are $NR^1$,
A is

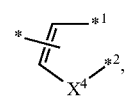

A1 wherein
$X^4$ is S or $NR^1$, and
A1 can be substituted with one substituent $R^2$,
B is

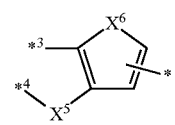

B2 wherein
X⁵ and X⁶ are independently from each other S or NR¹, and
B2 can be substituted with one substituent R²,
R¹ is at each occurrence selected from the group consisting of $C_{1-36}$-alkyl, $C_{2-36}$-alkenyl and $C_{2-36}$-alkynyl,
wherein
$C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, $-O-Si(R^{Sia})(R^{Sib})(R^{Sic})$, halogen, and CN; and at least two $CH_2$-groups, but not adjacent $CH_2$-groups, of $C_{1-36}$-alkyl, $C_{2-36}$-alkenyl and $C_{2-36}$-alkynyl can be replaced by O or S,
wherein
$R^a$ and $R^b$ are independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl
$R^{Sia}$, $R^{Sib}$ and $R^{Sic}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, $-[O-SiR^{Sid}R^{Sie}]_o-R^{Sif}$
wherein
o is an integer from 1 to 50,
$R^{Sid}$, $R^{Sie}$, $R^{Sif}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $-[O-SiR^{Sig}R^{Sih}]_pR^{Sij}$,
wherein
p is an integer from 1 to 50,
$R^{Sig}$ $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $O-Si(CH_3)_3$,
$R^5$, $R^6$, $R^{50}$, $R^{60}$, $R^{500}$ and $R^{600}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, and 5 to 10 membered heteroaryl,
$C_{1-20}$-alkyl, $C_{2-20}$-alkenyl and $C_{2-20}$-alkynyl can be substituted with one to ten substituents selected from the group consisting of halogen and CN,
R² is at each occurrence selected from the group consisting of unsubstituted $C_{1-30}$-alkyl and halogen, and
Y is at each occurrence I, Br, Cl or $O-S(O)_2CF_3$.
In even more preferred intermediates of formula (2)
X¹ is S, and X² and X³ are NR¹,
A is

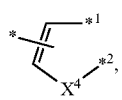

wherein
X⁴ is S and
A1 is not substituted,
B is

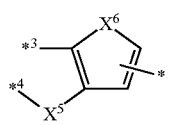

wherein
X⁵ and X⁶ are S, and
B2 is not substituted,
R¹ is at each occurrence unsubstituted $C_{1-36}$-alkyl, and
Y is at each occurrence I, Br, Cl or $O-S(O)_2CF_3$.

Most preferred intermediates of formula (2) are of formula (2-I)

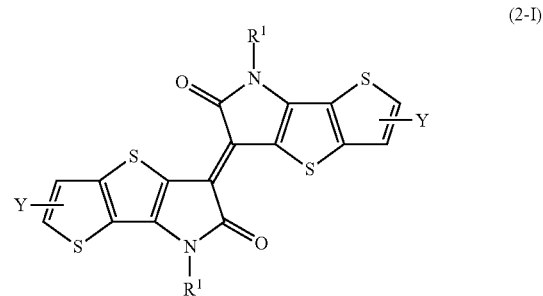

wherein Y is at each occurrence I, Br or $O-S(O)_2CF_3$, and R¹ is at each occurrence unsubstituted $C_{1-36}$-alkyl.

Particular preferred intermediate of formula (2) are of formula (2-II)

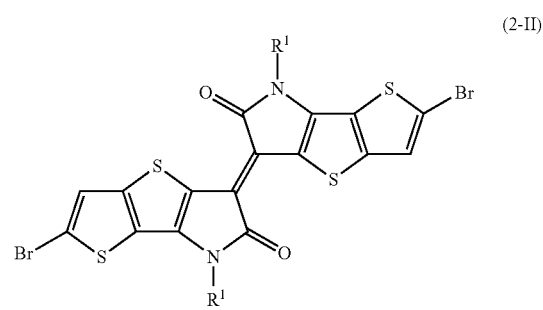

wherein, R¹ is at each occurrence unsubstituted $C_{1-36}$-alkyl.

Also part of the invention is an electronic device comprising the polymer of the present invention.

The electronic device can be an organic photovoltaic device (OPVs), an organic field-effect transistor (OFETs), an organic light emitting diode (OLEDs) or an organic photodiode (OPDs).

Preferably, the electronic device is an organic photovoltaic device (OPVs), an organic field-effect transistor (OFETs) or an organic photodiode (OPDs).

More preferably, the electronic device is an organic field effect transistor (OFET).

Usually, an organic field effect transistor comprises a dielectric layer, a semiconducting layer and a substrate. In addition, an organic field effect transistor usually comprises a gate electrode and source/drain electrodes.

Preferably, the semiconducting layer comprises the polymer of the present invention. The semiconducting layer can have a thickness of 5 to 500 nm, preferably of 10 to 100 nm, more preferably of 20 to 50 nm.

The dielectric layer comprises a dielectric material. The dielectric material can be silicon dioxide or aluminium oxide, or, an organic polymer such as polystyrene (PS), poly(methylmethacrylate) (PMMA), poly(4-vinylphenol) (PVP), poly(vinyl alcohol) (PVA), benzocyclobutene (BCB), or poly-imide (PI). The dielectric layer can have a thickness of 10 to 2000 nm, preferably of 50 to 1000 nm, more preferably of 100 to 800 nm.

The dielectric layer can in addition to the dielectric material comprise a self-assembled monolayer of organic silane derivates or organic phosphoric acid derivatives. An example of an organic silane derivative is octyltrichlorosilane. An examples of an organic phosphoric acid derivative is octyldecylphosphoric acid. The self-assembled monolayer comprised in the dielectric layer is usually in contact with the semiconducting layer.

The source/drain electrodes can be made from any suitable organic or inorganic source/drain material. Examples of inorganic source/drain materials are gold (Au), silver (Ag) or copper (Cu), as well as alloys comprising at least one of these metals. The source/drain electrodes can have a thickness of 1 to 100 nm, preferably from 20 to 70 nm.

The gate electrode can be made from any suitable gate material such as highly doped silicon, aluminium (Al), tungsten (W), indium tin oxide or gold (Au), or alloys comprising at least one of these metals. The gate electrode can have a thickness of 1 to 200 nm, preferably from 5 to 100 nm.

The substrate can be any suitable substrate such as glass, or a plastic substrate such as poly-ethersulfone, polycarbonate, polysulfone, polyethylene terephthalate (PET) and polyethylene naphthalate (PEN). Depending on the design of the organic field effect transistor, the gate electrode, for example highly doped silicon can also function as substrate.

The organic field effect transistor can be prepared by methods known in the art.

For example, a bottom-gate top-contact organic field effect transistor can be prepared as follows: The dielectric material, for example $Al_2O_3$ or silicon dioxide, can be applied as a layer on a gate electrode such as highly doped silicon wafer, which also functions as substrate, by a suitable deposition method such as atom layer deposition or thermal evaporation. A self-assembled monolayer of an organic phosphoric acid derivative or an organic silane derivative can be applied to the layer of the dielectric material. For example, the organic phosphoric acid derivative or the organic silane derivative can be applied from solution using solution-deposition techniques. The semiconducting layer can be formed by either solution deposition or thermal evaporation in vacuo of the polymer of the present invention on the self-assembled monolayer of the organic phosphoric acid derivative or the organic silane derivative. Source/drain electrodes can be formed by deposition of a suitable source/drain material, for example tantalum (Ta) and/or gold (Au), on the semiconducting layer through a shadow masks. The channel width (W) is typically 50 μm and the channel length (L) is typically 1000 μm.

For example, a top-gate bottom-contact organic field effect transistor can be prepared as follows: Source/drain electrodes can be formed by evaporating a suitable source/drain material, for example gold (Au), on photo-lithographically defined electrodes on a suitable substrate, for example a glass substrate. The semiconducting layer can be formed by depositing a solution of the polymers of the present invention, for example by spin-coating, on the source/drain electrodes, followed by annealing the layer at elevated temperatures such as at a temperature in the range of 80 to 360° C. After quenching the semiconducting layer, a dielectric layer can be formed by applying, for example, by spin-coating, a solution of a suitable dielectric material such as poly(methylmethacryate), on the semiconducting layer. The gate electrode of a suitable source/drain material, for example gold (Au), can be evaporated through a shadow mask on the dielectric layer.

Also part of the invention is the use of the polymer of the present invention as semiconducting material.

The polymers of the present invention show high charge carrier mobilities. The polymer of the present invention can show ambipolar properties with high hole and electron mobilities. In addition, the polymers of the present invention show a high stability, in particular a high thermal stability. Furthermore the polymers of the present invention are compatible with liquid processing techniques. In addition, the polymers of the present invention show a strong absorption of the near infra-red light.

EXAMPLES

Example 1

Preparation of Compound 3a

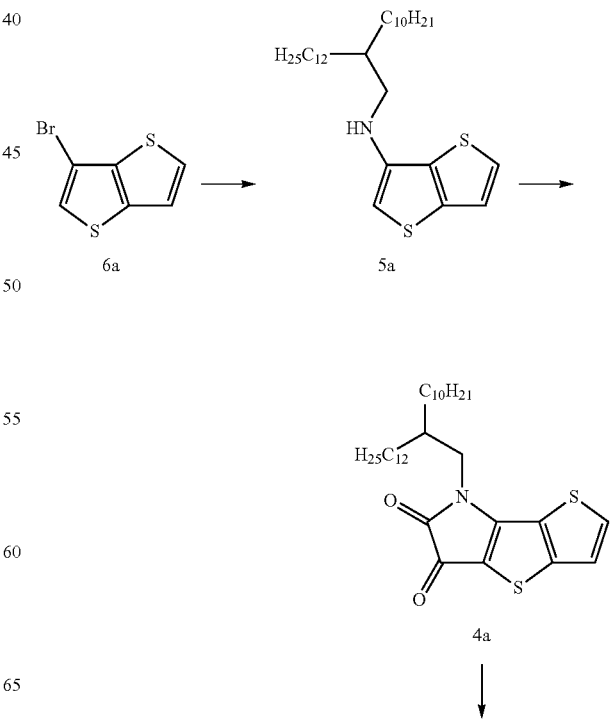

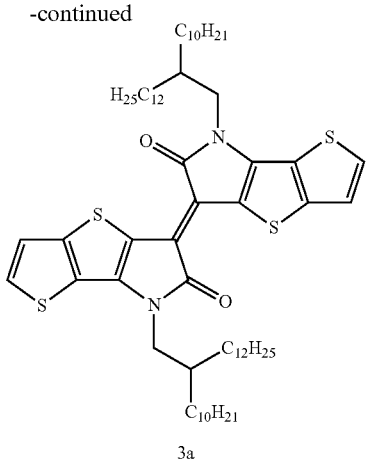

3a

Preparation of Compound 5a

Compound 6a (5.00 g, 22.82 mmol, 1 equiv.), copper (0.07 g, 1.14 mmol, 5 mol %) copper(I)-iodide (0.22 g, 1.14 mmol, 5 mol %), potassium phosphate tribasic (9.69 g, 45.64 mmol, 2 equiv.) and 2-decyltetradecyl amine (12.11 g, 34.23 mmol, 1.5 equiv.) were heated with stirring in dimethyl aminoethanol (50 mL) at 80° C. for 48 hours. Upon cooling to room temperature, water and hexane were added. The aqueous layer was extracted several times with hexanes. The organic layers were combined, dried over MgSO$_4$ and the solvent was removed by rotary evaporation. The crude product was passed through a small silica column using hexane as solvent to afford compound 5a as brown oil (1.74 g, 3.54 mmol, 15.5%). $^1$H NMR (400 MHz, CDCl$_3$); δ 7.36 (dd, J=5.3, 1.4 Hz, 1H), 6.05 (d, 1H, J=2.1 Hz), 3.56 (s, 1H), 3.13 (d, J=6.1 Hz, 2H), 1.29 (bm, 40H), 0.91 (m, 6H).

Preparation of Compound 4a

Dioxalyl chloride (0.50 g, 3.96 mmol, 1.3 equiv.) in DCM (10 mL) was added dropwise to a stirred solution of compound 5a (1.50 g, 3.05 mmol, 1 equiv.) in DCM (20 mL) at −10° C. After thirty minutes of stirring at −10° C., triethylamine (1.39 g, 13.72, 4.5 equiv.) was added and the solution was allowed to warm to room temperature overnight. Solvent and excess triethylamine were removed by rotary evaporation and the crude compound 4a was purified by column chromatography on silica with DCM as the eluent to afford the compound 4a as bright red solid (0.68 g, 1.24 mmol, 41%). $^1$H NMR (400 MHz, CDCl$_3$); δ 7.85 (d, J=5.3 Hz, 1H), 7.37 (d, J=5.1 Hz, 1H), 3.68 (d, J=7.7 Hz, 2H), 1.9 (m, 1H), 1.25 (bm, 40H), 0.88 (m, 6H).

Preparation of Compound 3a

A solution of compound 4a (0.60 g, 0.57 mmol, 1 equiv.) and Lawesson's reagent (0.11 g, 0.28 mmol, 0.5 equiv.) in o-xylene (20 mL) were heated at 60° C. for 2 hours. After cooling to room temperature the solvent was removed by rotary evaporation and the crude product purified by column chromatography on silica with hexane:DCM (3:1) as the eluent to afford compound 3a as a bright green solid (0.37 g, 0.35 mmol, 32%). $^1$H NMR (400 MHz, CDCl$_3$); δ 7.52 (d, J=5.2 Hz, 2H), 7.32 (d, J=5.2 Hz, 2H), 3.85 (d, J=7.7 Hz, 4H), 2.04 (m, 2H), 1.24 (bm, 80H), 0.90 (m, 12H).

Example 2

Preparation of Compound 2a

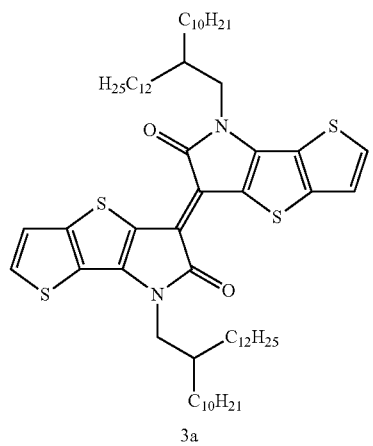

3a

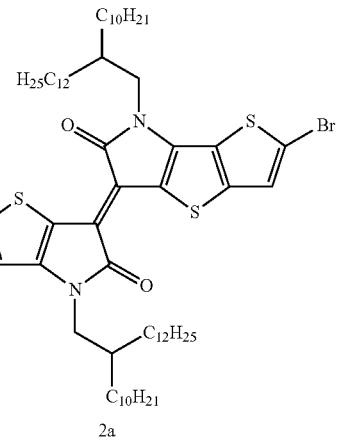

2a

N-bromosuccinimide (0.12 g, 0.69 mmol, 2.1 equiv.) in THF (1 mL) was added to a stirred solution of compound 3a (0.35 g, 0.33 mmol, 1 equiv.) in THF (20 mL) at 0° C. The reaction was monitored by TLC and quenched with water after half an hour, the product was extracted with ethyl acetate and the aqueous layer extracted several times with ethyl acetate. The organic layers were combined, dried over MgSO$_4$ and the solvent removed by rotary evaporation to afford the crude compound 2a which was purified by column chromatography on silica using hexane: DCM (3:1) as the eluent to afford the compound 2a as dark green solid (0.31 g, 0.26 mmol, 77%). $^1$H NMR (400 MHz, d$_2$-TCE); δ 7.35 (s, 2H), 3.80 (d, J=7.7 Hz, 4H), 1.96 (m, 2H), 1.27 (bm 80H), 0.93 (m, 12H).

Example 3

Preparation of Polymer Pa

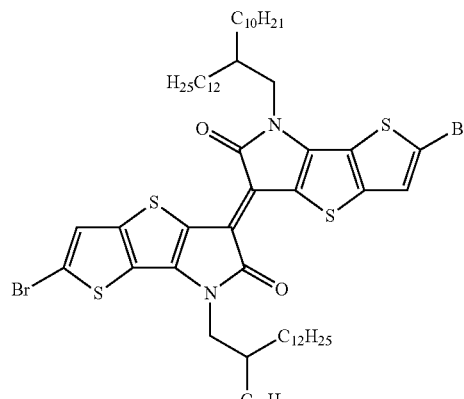

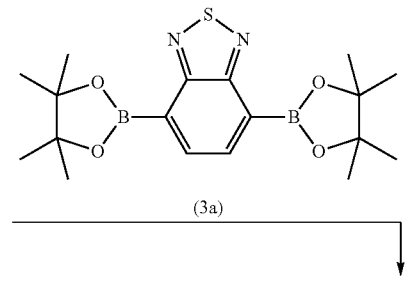

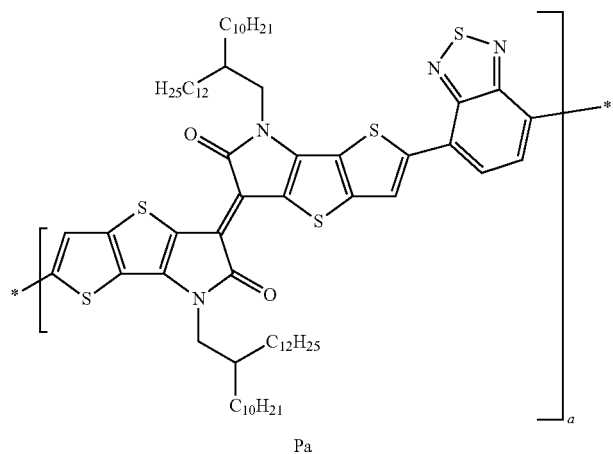

Compound 2a (70 mg, 0.06 mmol, 1 equiv.) and 4,7-bis(4,4,5,5-tetramethyl-1,3,2-dioxabrolan-2-yl)benzothiadiazole (3a) (22 mg, 0.06 mmol, 1 equiv.) were added to a microwave vial. A thoroughly degassed solution of Aliquat 336 (1 drop) in toluene (1.5 mL) was subsequently added and the solution was further degassed with stirring for 30 minutes. Pd(P(Ph)$_3$)$_4$ (3 mg) was added and the solution was again degassed for 30 minutes. The microwave vial was sealed and heated to 80° C. with stirring and then 2M Na$_2$CO$_3$(aq) (0.3 mL) were added. The biphasic mixture was then heated with vigorous stirring at 120° C. for 3 days. After cooling to room temperature the contents of the microwave vial were poured into vigorously stirred methanol and the resulting polymeric precipitate was filtered. The filtrate was purified by Soxhlet extraction first with acetone (24 h), second with hexane (24 h), and third with chloroform (24 h). The chloroform fraction was stirred vigorously with aqueous sodium diethyldithiocarbamate at 60° C. for 2 hours to remove any residual catalytic metal impurities, after which the chloroform layer was separated and the solvent removed by rotary evaporation. The obtained polymeric material was purified further by recycling gel permeation chromatography (GPC) in chlorobenzene to afford the polymer Pa (45 mg, 57%) as dark purple/black solid. GPC (chlorobenzene, 80° C., polystyrene standard): $M_n$=17 kDa, $M_w$=27 kDa, PDI=1.6. UV-VIS-absorption spectrum: $\lambda_{max}$: 926 nm (film) and 914 nm (solution). HOMO as determined by photoelectron spectroscopy in air (UV-PESA): −4.9 eV. HOMO as calculated by DFT/TD-DFT with a B3LYP/6-31 g*basis set: −4.7 eV. LUMO as determined from absorption onset in thin film UV-VIS spectra: −3.8 eV. LUMO as calculated by DFT/TD-DFT with a B3LYP/6-31 g*basis set: −3.5 eV. Eg as observed: 1.1 eV. Eg as calculated by DFT/TD-DFT with a B3LYP/6-31 g*basis set: 1.2 eV.

Example 4

Preparation of Polymer Pb

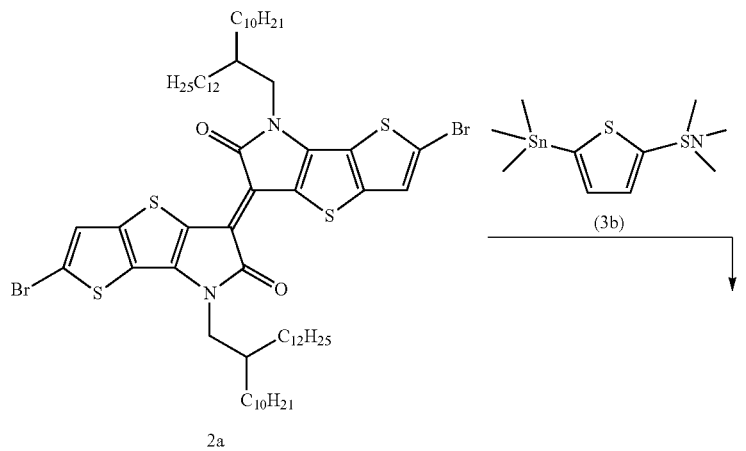

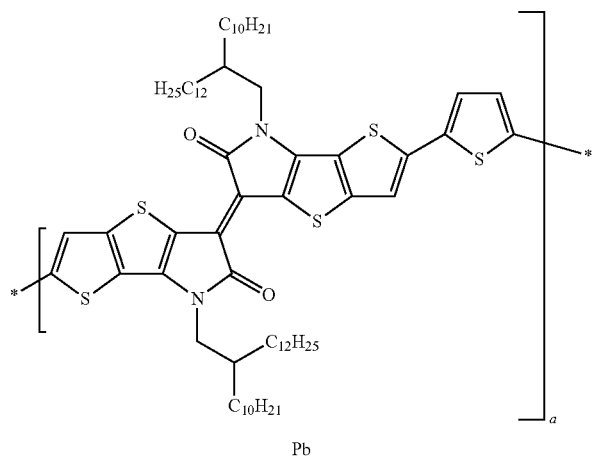

Compound 2a (70 mg, 0.06 mmol, 1 equiv.) and 2,5-bis(trimethylstannyl)thiophene (24 mg, 0.06 mmol, 1 equiv) in chlorobenzene (1.0 mL) were added to a microwave vial. The solution was thoroughly degassed before the addition of Pd$_2$(dba)$_3$ (2 mg) and P(o-Tol)$_3$ (2.5 mg). The solution was further degassed and the microwave vial sealed before heating in a microwave in successive intervals of 5 min at 100° C., 5 min at 140° C., 5 min at 160° C. and finally 20 min at 180° C. After cooling to room temperature the contents of the microwave vial were poured into vigorously stirred methanol, and the resulting polymeric precipitate was collected by filtration. The polymeric precipitate was purified by Soxhlet extraction first with acetone (24 h), second with hexane (24 h) and finally with chloroform (24 h). The chloroform fraction was stirred vigorously with aqueous sodium diethyldithiocarbamate at 60° C. for 2 hours to remove any residual catalytic metal impurities, after which the chloroform layer was separated and the solvent removed by rotary evaporation. The obtained polymeric material was further purified by recycling gel permeation chromatography (GPC) in chlorobenzene to afford the polymer Pb (31 mg, 47%) as deep purple/black solid. GPC (chlorobenzene, 80° C., polystyrene standard): $M_n$=30 kDa, $M_w$=67 kDa, PDI=2.3. UV-VIS-absorption spectrum: $\lambda_{max}$: 909 nm (film) and 897 nm (solution). HOMO as determined by photoelectron spectroscopy in air (UV-PESA): −4.8 eV. HOMO as calculated by DFT/TD-DFT with a B3LYP/6-31 g*basis set: −4.6 eV. LUMO as determined from absorption onset in thin film UV-VIS spectra: −3.6 eV. LUMO as calculated by DFT/TD-DFT with a B3LYP/6-31 g*basis set: −3.3 eV. Eg as observed: 1.2 eV. Eg as calculated by DFT/TD-DFT with a B3LYP/6-31 g*basis set: 1.3 eV.

Example 5

Preparation of Polymer Pc

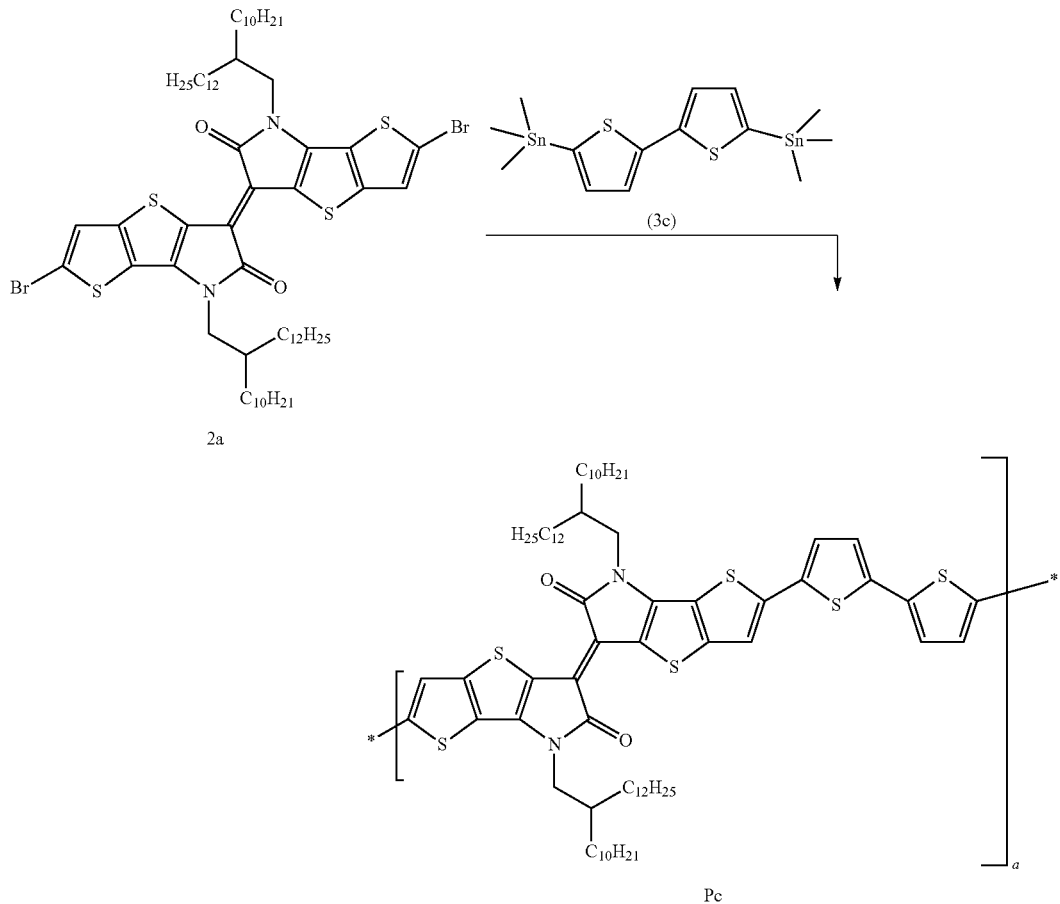

Compound 2a (70 mg, 0.06 mmol, 1 equiv.) and 5,5'-bis(trimethylstannyl)-2,2'-bithiophene (28 mg, 0.06 mmol, 1 equiv) in chlorobenzene (1.0 mL) were added to a microwave vial. The solution was thoroughly degassed before the addition of Pd$_2$(dba)$_3$ (2 mg) and P(o-Tol)$_3$ (2.5 mg). The solution was further degassed and the microwave vial sealed before heating in a microwave in successive intervals of 5 min at 100° C., 5 min at 140° C., 5 min at 160° C. and finally 20 min at 180° C. After cooling to room temperature the contents of the microwave vial were poured into vigorously stirred methanol, and the resulting polymeric precipitate was collected by filtration. The polymeric precipitate was purified by Soxhlet extraction first with acetone (24 h), second with hexane (24 h) and finally with chloroform (24 h). The chloroform fraction was stirred vigorously with aqueous sodium diethyldithiocarbamate at 60° C. for 2 hours to remove any residual catalytic metal impurities, after which the chloroform layer was separated and the solvent was removed by rotary evaporation. The obtained polymeric material was further purified by recycling gel permeation chromatography (GPC) in chlorobenzene to afford polymer Pc (42 mg, 60%) as deep purple/black solid. GPC (chlorobenzene, 80° C., polystyrene standard): M$_n$=20 kDa, M$_w$=41 kDa, PDI=2.1. UV-VIS-absorption spectrum: $\lambda_{max}$: 875 nm (film) and 864 nm (solution). HOMO as determined by photoelectron spectroscopy in air (UV-PESA): −4.8 eV. HOMO as calculated by DFT/TD-DFT with a B3LYP/6-31 g*basis set: −4.6 eV. LUMO as determined from absorption onset in thin film UV-VIS spectra: −3.6 eV. LUMO as calculated by DFT/TD-DFT with a B3LYP/6-31 g*basis set: −3.2 eV. Eg as observed: 1.2 eV. Eg as calculated by DFT/TD-DFT with a B3LYP/6-31 g*basis set: 1.4 eV.

Example 6

Preparation of Organic Field Effect Transistors Comprising the Polymer Pa, Pb, Respectively, Pc Organic field effect transistors (top-gate/bottom contact) were fabricated on glass substrates with Ti/Au (10 nm/30 nm) evaporated on photo-lithographically defined electrodes. The polymer Pa, Pb, respectively, Pc was deposited by spin coating from a 10 mg/mL dichlorobenzene solution and was annealed for 1 h at 100, 200 or 300° C., respectively. After annealing, the films were quenched on a cold metal surface and a 300 nm thick poly(methylmethacrylate) dielectric layer was spin-coated on top. A 20 nm thick gold layer was then evaporated through a shadow mask to define the transistor's top-gate. All fabrication steps were performed in an N$_2$ glove box. The channel characteristics are: L=20 μm, W=1 mm.

Pa, Pb and Pc were stable up to annealing temperatures of 350° C. with no observable thermal transition.

The saturation transfer curves of the organic field effect transistors comprising polymer Pa, Pb, respectively, Pc were measured at V$_d$=−60V using an Agilent 4155B Semiconductor Parameter Analyser (SPA) in a $N_2$ glove box. The average values of the electron mobilities $\mu_e$, the hole mobilities $\mu_h$ and the threshold voltages $V_{th}$ were determined from the square root of the saturation transfer curves and the results are summarized in table 1.

TABLE 1

| Polymer | $T_{anneal}$ [° C.] | $\mu_e$ [cm²/Vs] | $\mu_h$ [cm²/Vs] | $V_{th}$ (electrons) [V] | $V_{th}$ (holes) [V] |
|---|---|---|---|---|---|
| Pa | 100 | 0.2 | 0.1 | 14 | −10 |
|  | 200 | 0.5 | 0.3 | 12 | −13 |
|  | 300 | 0.7 | 0.4 | 13 | −20 |
| Pb | 100 | 0.01 | 0.01 | 7 | −32 |
|  | 200 | 0.2 | 0.2 | −18 | −24 |
|  | 300 | 0.2 | 0.2 | −24 | −22 |
| Pc | 100 | — | 0.01 | n/a$^a$ | 3 |
|  | 200 | 0.1 | 0.4 | −18 | −25 |
|  | 300 | 0.1 | 0.4 | −11 | −21 |

$^a$not-available.

Pa, Pb, respectively, Pc exhibit good ambipolar properties, with improvements in hole and electron mobilities observed at high temperature annealing. The electron transport is favoured in Pa, whereas the hole transport is favoured Pc. Pb shows a very balanced hole and electron transport.

The invention claimed is:
1. A polymer, comprising:
at least one unit of formula (1)

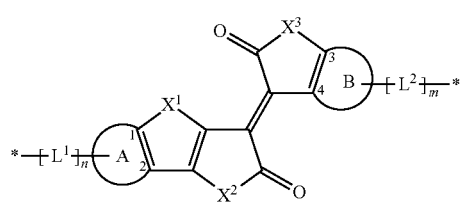

(1)

wherein
$X^1$, $X^2$ and $X^3$ are independently from each other S or $NR^1$,
A is

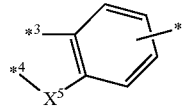

A1 wherein
$X^4$ is S or $NR^1$, and
A1 can be substituted with one substituent $R^2$,
B is selected from the group consisting of

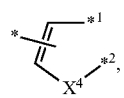

B1

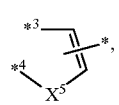

B2 and

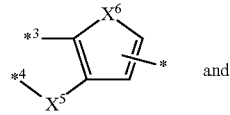

B3 wherein
$X^5$ and $X^6$ are independently from each other S or $NR^1$, and
B1, B2 and B3 can be substituted with one to three substituents $R^2$,
$R^1$ is at each occurrence selected from the group consisting of $C_{1-50}$-alkyl, $C_{2-50}$-alkenyl and $C_{2-50}$-alkynyl,
wherein
$C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$,
$Si(R^{Sia})(R^{Sib})(R^{Sic})$, —O—$Si(R^{Sia})(R^{Sib})(R^{Sic})$, halogen, and CN; and at least two $CH_2$-groups, but not adjacent $CH_2$-groups, of $C_{1-50}$-alkyl, $C_{2-50}$-alkenyl and $C_{2-50}$-alkynyl can be replaced by O or S,
wherein
$R^a$ is independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl,
$R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sid}R^{Sie}]_o$—$R^{Sif}$,
wherein
o is an integer from 1 to 50,
$R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sig}R^{Sih}]_p$—$R^{Sii}$,
wherein
p is an integer from 1 to 50,
$R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si$(CH_3)_3$,
and
$R^2$ is at each occurrence selected from the group consisting of unsubstituted $C_{1-30}$-alkyl and halogen,
n is 0, 1, 2 or 3,
m is 0, 1, 2 or 3,
and
$L^1$ and are $L^2$ are independently from each other and at each occurrence selected from the group consisting of $C_{6-18}$-arylene, 5 to 20 membered heteroarylene,

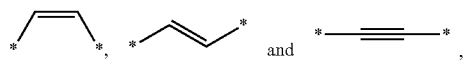

wherein
$C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, NR³¹—C(O)—R³², C(O)—NR³¹R³², N[C(O)R³¹][C(O)R³²], SR³¹, halogen, CN, SiR^{Siv}R^{Siw}R^{Six} and OH, and
wherein

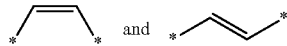

can be substituted with one or two substituents R⁴ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, C(O)—R⁴¹, C(O)—NR⁴¹R⁴², C(O)—OR⁴¹ and CN,
wherein
R³¹, R³², R⁴¹ and R⁴² are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, OR^i, OC(O)—R^j, C(O)—OR^i, C(O)—R^i, NR^iR^j, NR^i—C(O)R^j, C(O)—NR^iR^j, N[C(O)R^i][C(O)R^j], SR^i, halogen, CN, SiR^{Siv}R^{Siw}R^{Six} and NO₂; and at least two CH₂-groups, but not adjacent CH₂-groups of $C_{1-30}$-alkyl, $C_{2-30}$-alkenyl and $C_{2-30}$-alkynyl can be replaced by O or S,
$C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, OR^i, OC(O)—R^j, C(O)—OR^i, C(O)—R^i, NR^iR^j, NR^i—C(O)R^j, C(O)—NR^iR^j, N[C(O)R^i][C(O)R^j], SR^i, halogen, CN, SiR^{Siv}R^{Siw}R^{Six} and NO₂; and one or two CH₂-groups, but not adjacent CH₂-groups, of $C_{5-12}$-cycloalkyl can be replaced by O, S, OC(O), CO, NR^i or NR^i—CO,
$C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, OR^i, OC(O)—R^j, C(O)—OR^i, C(O)—R^i, NR^iR^j, NR^i—C(O)R^j, C(O)—NR^iR^j, N[C(O)R^i][C(O)R^j], SR^i, halogen, CN, SiR^{Siv}R^{Siw}R^{Six} and NO₂,
wherein
R^{Siv}, R^{Siw}, and R^{Six} are independently from each other selected from the group consisting of H, $C_{1-20}$-alkyl, $C_{2-20}$-alkenyl, $C_{2-20}$-alkynyl, $C_{5-6}$-cycloalkyl, phenyl and O—Si(CH₃)₃,
R^i and R^j are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, OR^k, OC(O)—R^l, C(O)—OR^k, C(O)—R^k, NR^kR^l, NR^k-C(O)R^l, C(O)—NR^kR^l, N[C(O)R^k][C(O)R^l], SR^k, halogen, CN, and NO₂;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR^k, OC(O)—R^l, C(O)—OR^k, C(O)—R^k, NR^kR^l, NR^k—C(O)R^l, C(O)—NR^kR^l, N[C(O)R^k][C(O)R^l], SR^k, halogen, CN, and NO₂;
$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR^k, OC(O)—R^l, C(O)—OR^k, C(O)—R^k, NR^kR^l, NR^k—C(O)R^l, C(O)—NR^kR^l, N[C(O)R^k][C(O)R^l], SR^k, halogen, CN, and NO₂;
wherein
R^k and R^l are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and NO₂.

2. The polymer of claim 1, wherein
X¹ is S, and X² and X³ are NR¹.

3. The polymer of claim 1, wherein
A is

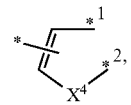

wherein
X⁴ is S or NR¹, and
A1 can be substituted with one substituent R²,
B is

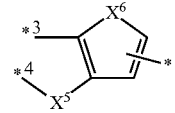

wherein
X⁵ and X⁶ are independently from each other S or NR¹, and
B2 can be substituted with one substituent R²,
R¹ is at each occurrence selected from the group consisting of $C_{1-36}$-alkyl, $C_{2-36}$-alkenyl and $C_{2-36}$-alkynyl,
wherein
$C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, OR^a, SR^a, Si(R^{Sia})(R^{Sib})(R^{Sic}), —O—Si(R^{Sia})(R^{Sib})(R^{Sic}), halogen, and CN; and at least two CH₂-groups, but not adjacent CH₂-groups, of $C_{1-36}$-alkyl, $C_{2-36}$-alkenyl and $C_{2-36}$-alkynyl can be replaced by O or S, wherein R$^a$ is selected from the group consisting of H, C$_{1-20}$-alkyl, C$_{2-20}$-alkenyl, C$_{2-20}$-alkynyl, C$_{5-6}$-cycloalkyl and C$_{6-10}$-aryl R$^{Sia}$, R$^{Sib}$ and R$^{Sic}$ are independently selected from the group consisting of H, C$_{1-20}$-alkyl, C$_{2-20}$-alkenyl, C$_{2-20}$-alkynyl, C$_{5-6}$-cycloalkyl, C$_{6-10}$-aryl, —[O—SiR$^{Sid}$R$^{Sic}$]$_o$—R$^{Sif}$ wherein o is an integer from 1 to 50, R$^{Sid}$, R$^{Sie}$, R$^{Sif}$ are independently selected from the group consisting of H, C$_{1-30}$-alkyl, C$_{2-20}$-alkenyl, C$_{2-20}$-alkynyl, C$_{5-6}$-cycloalkyl, C$_{6-10}$-aryl, —[O—SiR$^{Sig}$R$^{Sih}$]$_p$—R$^{Sii}$, wherein p is an integer from 1 to 50, R$^{Sig}$ R$^{Sih}$, R$^{Sii}$ are independently selected from the group consisting of H, C$_{1-30}$-alkyl, C$_{2-20}$-alkenyl, C$_{2-20}$-alkynyl, C$_{5-6}$-cycloalkyl, C$_{6-10}$-aryl, O—Si(CH$_3$)$_3$, and R$^2$ is at each occurrence selected from the group consisting of unsubstituted C$_{1-30}$-alkyl and halogen.

4. The polymer of claim 1, wherein

A is

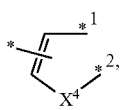

A1 wherein

X$^4$ is S and

A1 is not substituted,

B is

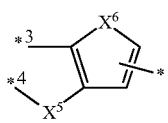

B2 wherein

X$^5$ and X$^6$ are S, and

B2 is not substituted, and

R$^1$ is at each occurrence unsubstituted C$_{1-36}$-alkyl.

5. The polymer of claim 1, wherein

L$^1$ and L$^2$ are independently from each other and at each occurrence selected from the group consisting of 5 to 20 membered heteroarylene, and

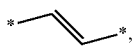

wherein 5 to 20 membered heteroarylene can be substituted with one to six substituents R$^3$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, OR$^{31}$, OC(O)—R$^{31}$, C(O)— OR$^{31}$, C(O)—R$^{31}$, NR$^{31}$R$^{32}$, NR$^{31}$—C(O)R$^{32}$, C(O)— NR$^{31}$R$^{32}$, SR$^{31}$, halogen, CN, SiR$^{Siv}$R$^{Siw}$R$^{Six}$ and OH, and wherein

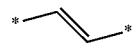

can be substituted with one or two substituents R$^4$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, C(O)— R$^{41}$, C(O)—NR$^{41}$R$^{42}$, C(O)—OR$^{41}$ and CN, wherein R$^{31}$, R$^{32}$, R$^{41}$ and R$^{42}$ are independently from each other and at each occurrence selected from the group consisting of H, C$_{2-30}$-alkenyl, C$_{2-30}$-alkynyl, C$_{5-12}$-cycloalkyl, C$_{6-18}$-aryl and 5 to 20 membered heteroaryl, and wherein C$_{1-30}$-alkyl, C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of C$_{5-12}$-cycloalkyl can be replaced by O, S, OC(O), CO, NR$^i$ or NR$^i$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$, wherein R$^{Siv}$, R$^{Siw}$, and R$^{Six}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, R$^i$ and R$^j$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)-R^l$, $C(O)-OR^k$, $C(O)-R^k$, $NR^kR^l$, $NR^k-C(O)R^l$, $C(O)-NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)-R^l$, $C(O)-OR^k$, $C(O)-R^k$, $NR^kR^l$, $NR^k-C(O)R^l$, $C(O)-NR^kR^l$, $N[C(O)R^k][C(O)R^l]$, $SR^k$, halogen, CN, and $NO_2$;

wherein
$R^k$ and $R^l$ are independently selected from the group consisting of H, $C_{1-10}$-alkyl, $C_{2-10}$-alkenyl and $C_{2-10}$-alkynyl, and
wherein
$C_{1-10}$-alkyl, $C_{2-10}$-alkenyl and $C_{2-10}$-alkynyl can be substituted with one to five substituents selected from the group consisting of halogen, CN and $NO_2$.

6. The polymer of claim 1, wherein
$L^1$ and $L^2$ are independently from each other and at each occurrence selected from the group consisting of 5 to 20 membered heteroarylene, and

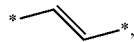

wherein 5 to 20 membered heteroarylene is selected from the group consisting of

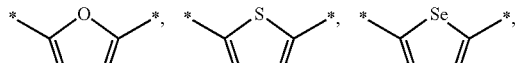
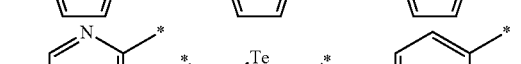
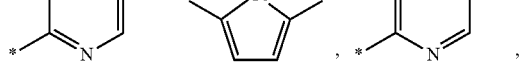
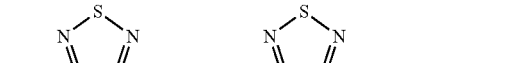
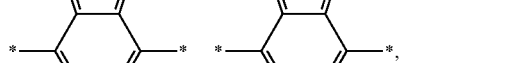
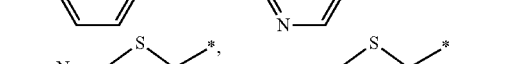

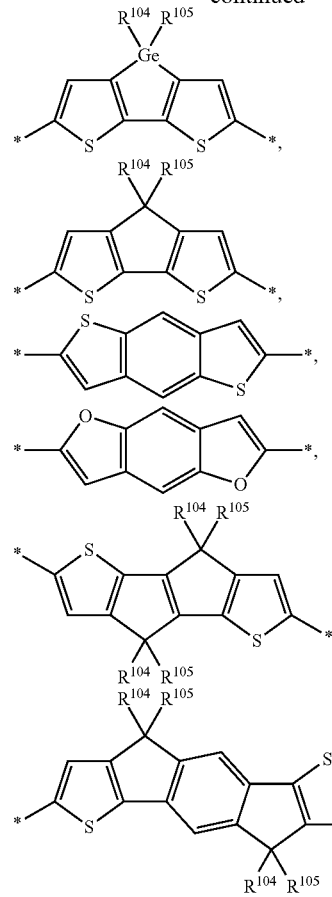

wherein
$R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and $R^{105}$, if attached to the same atom, together with the atom, to which they are attached, form a 5 to 12 membered ring system,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^s$, $OC(O)-R^t$, $C(O)-OR^s$, $C(O)-R^s$, $NR^sR^t$, $NR^s-C(O)R^t$, $C(O)-NR^sR^t$, $N[C(O)R^s][C(O)R^t]$, $SR^s$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)-R^t$, $C(O)-OR^s$, $C(O)-R^s$, $NR^sR^t$, $NR^s-C(O)R^t$, $C(O)-NR^sR^t$, $N[C(O)R^s][C(O)R^t]$, $SR^s$, halogen, CN, and $NO_2$;

C<sub>6-14</sub>-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

wherein $R^s$ and $R^t$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$, wherein 5 to 20 membered heteroarylene can be substituted with one to six substituents $R^3$ at each occurrence selected from the group consisting of $C_{1-30}$-alkyl and halogen, and wherein

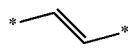

can be substituted with one or two substituents $R^4$ at each occurrence selected from the group consisting of $C_{1-30}$-alkyl, $C(O)$—$R^{41}$, $C(O)$—$OR^{41}$ and CN, and wherein $R^{41}$ is at each occurrence $C_{1-30}$-alkyl.

7. The polymer of claim 1, wherein $L^1$ and $L^2$ are independently from each other and at each occurrence 5 to 20 membered heteroarylene, wherein 5 to 20 membered heteroarylene is selected from the group consisting of

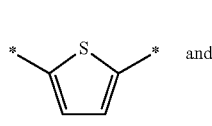

wherein 5 to 20 membered heteroarylene is unsubstituted.

8. The polymer of claim 5, wherein n is 0, 1 or 2, and m is 0, 1 or 2.

9. A process for the preparation of the polymer of claim 1, wherein n is 0 and which are of formula (1-I)

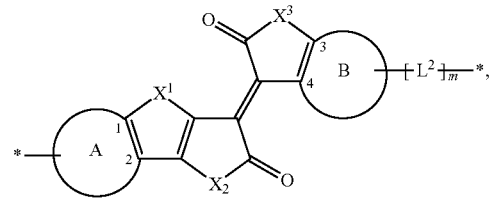

which process comprises:

treating a compound of formula (2)

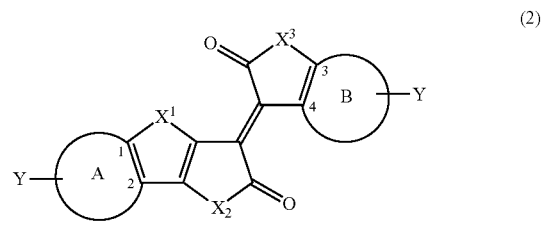

wherein Y is at each occurrence I, Br, Cl or O—$S(O)_2CF_3$, and $X^1$, $X^2$, $X^3$, A and B are as defined for the compound of formula (1)

with m mol equivalents of a compound of formula (3)

$$Z^a\text{-}L^2\text{-}Z^b \quad (3)$$

wherein $L^2$ is as defined for the compound of formula (1), and $Z^a$ and $Z^b$ are independently selected from the group consisting of $B(OZ^1)(OZ^2)$, $SnZ^1Z^2Z^3$,

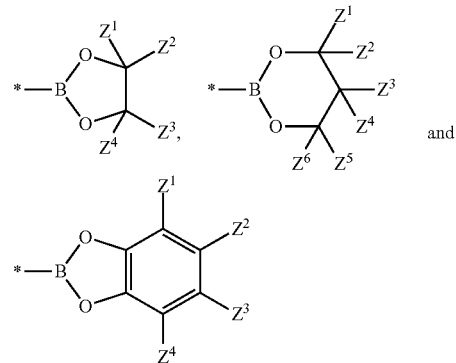

wherein $Z^1$, $Z^2$, $Z^3$, $Z^4$, $Z^5$ and $Z^6$ are independently from each other and at each occurrence H or $C_{1-4}$-alkyl.

10. An electronic device, comprising:

a polymer of claim 1.

11. The electronic device of claim 10, wherein the electronic device is an organic field effect transistor.

12. A method of making a semiconductor, the method comprising:

depositing a polymer according to claim 1 onto a substrate.

13. A method of transmitting electrons within a semiconductor material, the method comprising:

passing electrons through a polymer according to claim 1, said polymer comprised within a semiconductor device.

* * * * *